United States Patent
Syouda et al.

(10) Patent No.: US 10,042,005 B2
(45) Date of Patent: Aug. 7, 2018

(54) INTERNAL RESISTANCE CALCULATING DEVICE

(71) Applicant: YAZAKI CORPORATION, Tokyo (JP)

(72) Inventors: Takahiro Syouda, Shizuoka (JP); Youko Takagi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 79 days.

(21) Appl. No.: 15/238,469

(22) Filed: Aug. 16, 2016

(65) Prior Publication Data

US 2017/0052230 A1    Feb. 23, 2017

(30) Foreign Application Priority Data

Aug. 21, 2015  (JP) .................................. 2015-163482
Jul. 22, 2016  (JP) .................................. 2016-144604

(51) Int. Cl.
*G01N 27/416* (2006.01)
*G01R 31/36* (2006.01)
*B60L 11/18* (2006.01)
*H02J 7/00* (2006.01)

(52) U.S. Cl.
CPC ...... *G01R 31/3662* (2013.01); *B60L 11/1851* (2013.01); *H02J 7/0068* (2013.01)

(58) Field of Classification Search
CPC . G01R 31/3662; B60L 11/1851; H02J 7/0068
See application file for complete search history.

(56) References Cited

U.S. PATENT DOCUMENTS

| | | | | |
|---|---|---|---|---|
| 5,365,453 A | * | 11/1994 | Startup | G01R 31/3648 320/136 |
| 2008/0054909 A1 | * | 3/2008 | Fukuda | G01R 31/3662 324/429 |
| 2012/0043454 A1 | * | 2/2012 | Sakuragi | G01J 1/46 250/206 |

FOREIGN PATENT DOCUMENTS

JP        5228403 B2     7/2013

* cited by examiner

*Primary Examiner* — Daniel Miller
(74) *Attorney, Agent, or Firm* — Kenealy Vaidya LLP

(57) ABSTRACT

An internal resistance calculating device includes a charging unit charging a secondary battery, a voltage measuring unit measuring a both-end voltage value of the secondary battery, a capacitor holding a first voltage value predetermined by the both-end voltage value measured by the voltage measuring unit after charging is started, a capacitor holding, as a second voltage value, the both-end voltage value when charge current is changed for a predetermined current value or more within predetermined time after the both-end voltage value become the first voltage value, a current measuring unit measuring a first charge current value when the both-end voltage value become a threshold-value voltage and a second charge current value when the both-end voltage value become the second voltage value, and a μCOM calculating an internal resistance value of the secondary battery based on the first and second voltage values and the first and second charge current values.

4 Claims, 17 Drawing Sheets

INTERNAL RESISTANCE CALCULATING DEVICE

BACKGROUND

Technical Field

The present invention relates to an internal resistance calculating device which calculates an internal resistance value of a battery such as a secondary battery.

Related Art

Various vehicles, such as an electric vehicle (EV) which runs using an electric motor and a hybrid vehicle (HEV) which runs using both an engine and an electric motor, are provided with a secondary battery such as a lithium ion rechargeable battery and a nickel-metal hydride rechargeable battery as a power source of the electric motor.

In the secondary battery used in the EV and the HEV, SOH (State Of Health) is determined by a rate of a current capacity to an initial capacity of the secondary battery. For example, if the current capacity is 80% of the initial capacity, SOH is 80%. There are many methods for detecting the SOH, but as one of them, there is a method for estimating the SOH based on an internal resistance value of the secondary battery.

As a calculating method of an internal resistance value of a secondary battery, there is a method described in JP 5228403 B2 for example. JP 5228403 B2 includes a current detecting circuit 23 connected in series to an electricity storage portion 25, a first sample hold circuit 27 connected to the electricity storage portion 25, a second sample hold circuit 29, and a differential amplification circuit 43 to which outputs of both the first sample hold circuit 27 and the second sample hold circuit 29 are connected. It discloses that in a state where the electricity storage portion 25 is charged or discharged at a constant current value Ic, voltage hold timing when the charge or the discharge is interrupted is defined as a time point when a predetermined time is elapsed after the interruption, and voltage hold timing when the charge or the discharge is restarted is defined as a time point when a current value from the current detecting circuit 23 becomes equal to the constant current value Ic within a detection error range.

Patent Literature 1: JP 5228403 B2

SUMMARY

However, the method disclosed in JP 5228403 B2 has a problem that, since the SOC (State Of Charge) is not taken into account when carrying out the measurement for calculating the internal resistance, the internal resistance values vary due to the SOC at the time of measurement.

Also, the method disclosed JP 5228403 B2 requires the charge or the discharge to be temporarily interrupted for calculating the internal resistance.

In view of the above problems, it is an object of the present invention to provide an internal resistance calculating device capable of calculating internal resistance with high accuracy and with a simple configuration.

The invention according to a first aspect made to achieve the object is an internal resistance calculating device for calculating an internal resistance value of a secondary battery, the device including: a charging/discharging unit configured to charge or discharge the secondary battery; a voltage measuring unit configured to measure a both-end voltage value of the secondary battery; a first voltage holding unit configured to hold a first voltage value which is predetermined by the both-end voltage value measured by the voltage measuring unit after the charging or the discharging carried out by the charging/discharging unit is started; a second voltage holding unit configured to hold, as a second voltage value, the both-end voltage value of the secondary battery when charge current or discharge current is changed for a predetermined value or more within a predetermined time after the both-end voltage value has become the first voltage value; a current measuring unit configured to measure a first current value which is a charge current value or a discharge current value when the both-end voltage value has become the first voltage value, and a second current value which is a charge current value or a discharge current value when the both-end voltage value has become the second voltage value; and an internal resistance calculating unit configured to calculate an internal resistance value of the secondary battery based on the first voltage value, the second voltage value, the first current value and the second current value.

The invention according to a second aspect is the internal resistance calculating device according to the first aspect, wherein the internal resistance calculating unit includes a differential amplifier configured to calculate a difference between the first voltage value held in the first voltage holding unit and the second voltage value held in the second voltage holding unit.

The invention according to a third aspect is the internal resistance calculating device according to the second aspect, wherein each of the first voltage holding unit and the second voltage holding unit is constituted of a capacitor, and the internal resistance calculating device includes a switching unit configured to switch between the capacitor holding the first voltage value and the capacitor holding the second voltage value to connect the switched one of the capacitors to one of terminals of the secondary battery.

The invention according to a fourth aspect is the internal resistance calculating device according to the third aspect, wherein the second voltage holding unit holds, as the second voltage value, the both-end voltage value of the secondary battery after charging time of the capacitor is elapsed after the charge current or the discharge current is changed for the predetermined current value or more within the predetermined time, and the current measuring unit measures, as the second current value, the charge current value or the discharge current value after the charging time is elapsed.

According to the invention according to the first aspect, as described above, since the first voltage value is a predetermined value, the measurements can be made with the constant SOC. It is known that there is a correlation between the SOC and the battery terminal voltage (i.e., the both-end voltage), thus, by carrying out the measurements with the constant SOC, the variation in the internal resistances due to the SOC can be prevented. Furthermore, there is no need to temporarily interrupt the charging or discharging to calculate the internal resistance, and the timing of the calculation of the internal resistance will generate naturally and automatically at the time of the charging/discharging of the secondary battery B in the EV or the HEV, for example.

According to the invention according to the second aspect, the differential amplifier can calculate the differential between the first voltage value and the second voltage value, and can amplify that differential value by a required amplification factor. Thus, the difference between the first voltage value and the second voltage value can be detected even if it is very small. Consequently, there is no need to take measures for reduced noise, and also an AD converter of high resolution and such is not required.

According to the invention according to the third aspect, the first voltage value and the second voltage value are held in the two capacitors hold by switching the switch. Consequently, the first voltage value and the second voltage value can be obtained without being influenced from the cell voltage.

According to the invention according to the fourth aspect, the second voltage value is held after the charging time of the capacitor is elapsed, and the second charge current value corresponds to the charge current value or the discharge current value measured at that time. Thus, the procedure waits until the potential of the capacitor becomes equal to the voltage that is the same as the both-end voltage value of the secondary battery. Thus, the second voltage value and the second charge current value can be measured with high accuracy.

DETAILED DESCRIPTION

First Embodiment

Figure 1:
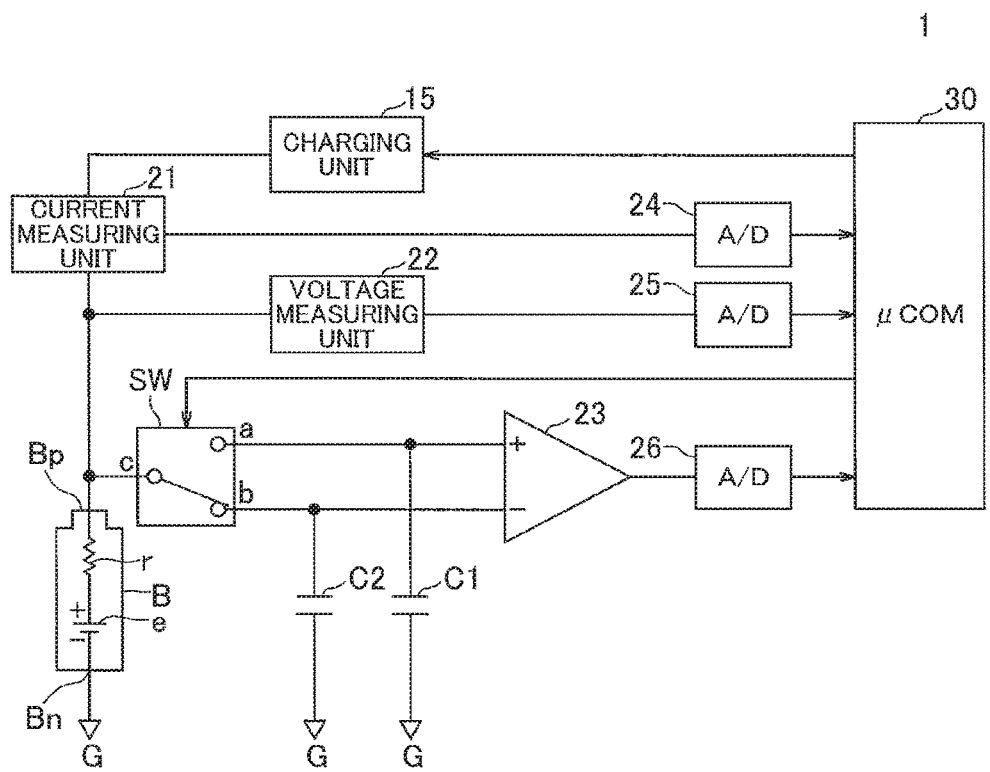
FIG. 1 is a schematic block diagram of an internal resistance calculating device according to a first embodiment of the present invention.

A first embodiment of the present invention will be described with reference to the drawings. FIG. 1 is a schematic block diagram of an internal resistance calculating device according to the first embodiment of the invention.

The internal resistance calculating device of this embodiment is provided in an EV for example, and calculates an internal resistance value of a secondary battery which is provided in the EV. Of course, the present invention may be applied to a device and a system having a secondary battery other than the EV.

As shown in FIG. 1, the internal resistance calculating device (indicated by a reference sign 1 in the drawings) of this embodiment is connected to a secondary battery B provided in an EV or an HEV (not shown), and calculates an internal resistance value of the secondary battery B.

Figure 2:
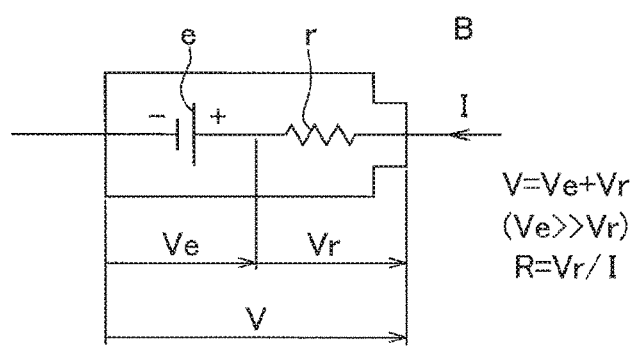
FIG. 2 is an explanatory diagram showing a relationship between a both-end voltage of a secondary battery shown in FIG. 1, an electromotive force and internal resistance.

The secondary battery B includes an electromotive force portion e which generates voltage, and an internal resistance r. As shown in FIG. 2, the secondary battery B generates a voltage V between both electrodes (i.e., a positive electrode Bp and a negative electrode Bn). When the secondary battery B is charged with current I, the voltage V is the sum of a voltage value (i.e., a cell voltage) Ve generated by electromotive force caused by the electromotive force portion e, and a voltage value (i.e., a voltage drop) Vr generated when the current flows through the internal resistance r (thus, V=Ve+Vr). Thus, if the current I is changed, the voltage drop Vr is also changed (i.e., Vr=R×I, R is an internal resistance value).

The internal resistance calculating device 1 of this embodiment includes a charging unit 15, a current measuring unit 21, a voltage measuring unit 22, a differential amplifier 23, a first analogue-to-digital converter 24, a second analogue-to-digital converter 25, a third analogue-to-digital converter 26, a μCOM 30, a switch SW, and capacitors C1 and C2.

The charging unit 15 includes, for example, a power supply device capable of outputting charge current with an arbitrary current value to the secondary battery B by being supplied with electricity from an external power supply device connected to the EV or the like. A pair of output terminals of the charging unit 15 is connected to the positive electrode Bp and the negative electrode Bn of the secondary battery B, respectively. The charging unit 15 is control led by the later-described μCOM 30, thereby outputting a predetermined charge current when charging the secondary battery B. That is, the charging unit functions as a charging/discharging unit for charging the secondary battery B.

The current measuring unit 21 is provided in series between one of the terminals of the charging unit 15 and the positive electrode Bp of the secondary battery B. The current measuring unit 21 measures and outputs a current value of current flowing in a charging direction and in a discharging direction of the secondary battery B.

The voltage measuring unit 22 outputs a signal (i.e., a voltage signal) according to a voltage between the positive electrode Bp and the negative electrode Bn of the secondary battery B (i.e., a both-end voltage). In this embodiment, for example, the internal resistance calculating device includes a plurality of fixed resistors which divides the voltage between the both electrodes of the secondary battery B into partial voltages so as to fall within a range of voltage which can be inputted to the later-described second analogue-to-digital converter 25.

The differential amplifier 23 calculates a difference between the both-end voltage value of the secondary battery B held in the later-described capacitor C1 and the both-end voltage value of the secondary battery B held in the capacitor C2, amplifies the difference with an amplification factor Av and outputs the resultant.

The first analogue-to-digital converter 24 (hereinafter called "first A/D 24") quantizes an analog signal outputted from the current measuring unit 21 and outputs a signal indicative of a digital value of this analog signal. Similarly, the second analogue-to-digital converter 25 (hereinafter called "second A/D 25") quantizes an analog signal outputted from the voltage measuring unit 22 and outputs a signal indicative of a digital value of this analog signal. Similarly, the third analogue-to-digital converter 26 (hereinafter called "third A/D 26") quantizes an analog signal outputted from the differential amplifier 23 and outputs a signal indicative of a digital value of this analog signal. Although in this embodiment the first A/D 24, the second A/D 25 and the third A/D 26 are mounted as individual electronic components, the present invention is not limited to this, and the respective signals may be quantized using an analogue-to-digital converter embedded in the later-described μCOM 30.

The μCOM 30 is a microcomputer including a CPU, a ROM, a RAM, a timer and such, and governs the control of the entire internal resistance calculating device 1. A control program and such for making the CPU to function as the internal resistance calculating unit is preliminarily stored in the ROM. The CPU functions as the internal resistance by executing this control program.

Furthermore, the μCOM 30 outputs a control signal to the charging unit 15 to conduct the charging of the secondary battery B. The output signals from the first A/D 24, the second A/D 25 and the third A/D 26 are inputted to the μCOM 30. Furthermore, the μCOM 30 outputs a switching signal for the switch SW.

The switch SW is a switch that can switch the connection between a terminal c on one side and one of terminals a, b on the other side. The terminal c of the switch SW is connected to the positive electrode Bp of the secondary battery B, the terminal a is connected to one side of the capacitor C1 and to a + input terminal (i.e., a non-inverting input terminal) of the differential amplifier 23, and the terminal b is connected to one side of the capacitor C2 and to a – input terminal (i.e., an inverting input terminal) of the differential amplifier 23. That is, the switch SW functions as a switch that switches between the connection of the capacitor C1 to the positive electrode Bp of the secondary battery B and the connection of the capacitor C2 to the positive electrode Bp of the secondary battery B.

The capacitor C1 is a small capacity capacitor having one side connected to the terminal a of the switch SW and the other side that is grounded. As will be described later, the capacitor C1 is electrically connected to the positive electrode Bp of the secondary battery B when the switch SW is switched to the terminal a, and thus potential of the capacitor C1 can be equal to the both-end voltage of the secondary battery B.

The capacitor C2 is a small capacity capacitor having one side connected to the terminal b of the switch SW and the other side that is grounded. As will be described later, the capacitor C2 is electrically connected to the positive electrode Bp of the secondary battery B when the switch SW is switched to the terminal b, and thus potential of the capacitor C2 can be equal to the both-end voltage of the secondary battery B.

As described above, the both-end voltage V of the secondary battery B is the sum of the cell voltage Ve and the voltage drop Vr, and when the current (i.e., the charge current) is changed, the voltage drop Vr is also changed. Here, if the voltage drops during the charging with different charge current values Ic and Id are defined as Vrc and Vrd, respectively, then, when Ic>Id, there is provided Vrc>Vrd. If both-end voltage value of the secondary battery B with the voltage drop Vrc is defined as Vc, and the both-end voltage value of the secondary battery B with the voltage drop Vrd is defined as Vd, then, since Vc=Ve+Vrc and Vd=Ve+Vrd, there is provided Vc−Vd=Vrc−Vrd. Thus, by inputting the both-end voltages of the secondary battery B to the differential amplifier 23, Vrc−Vrd can be obtained.

Figure 3:
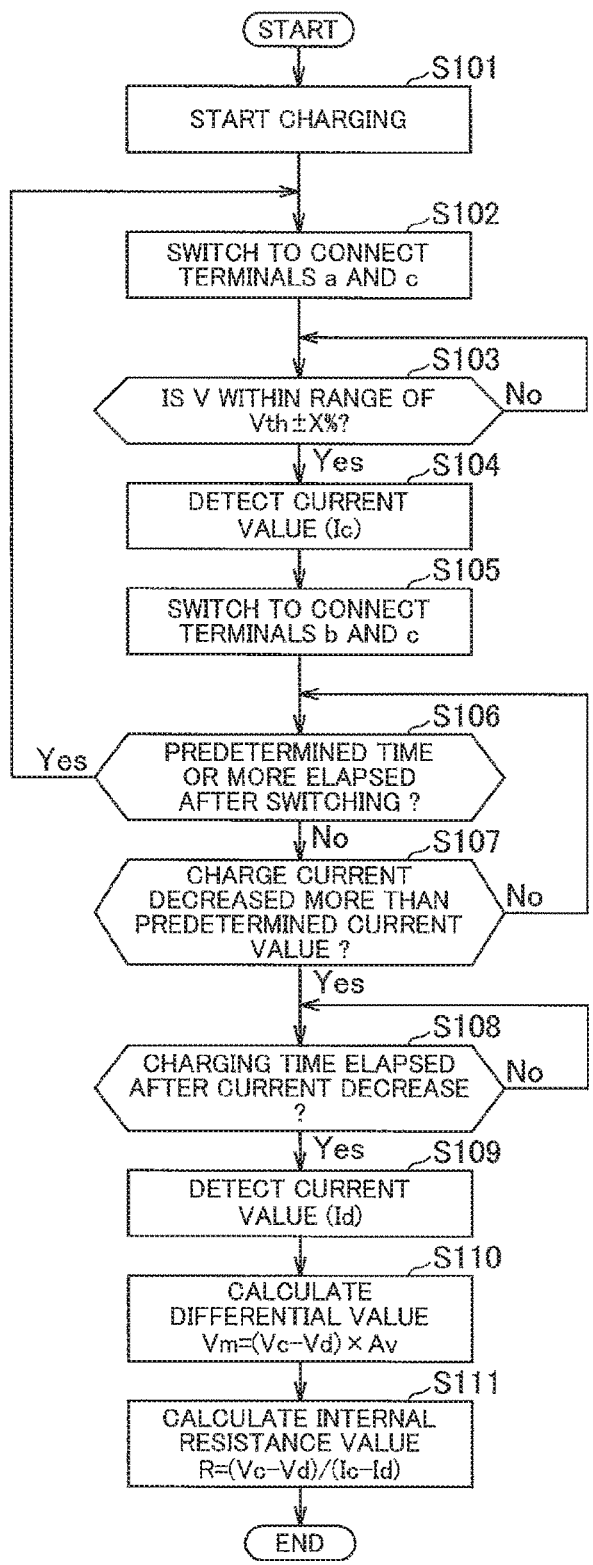
FIG. 3 is a flowchart of operation of the internal resistance calculating device shown in FIG. 1.
Figure 4:
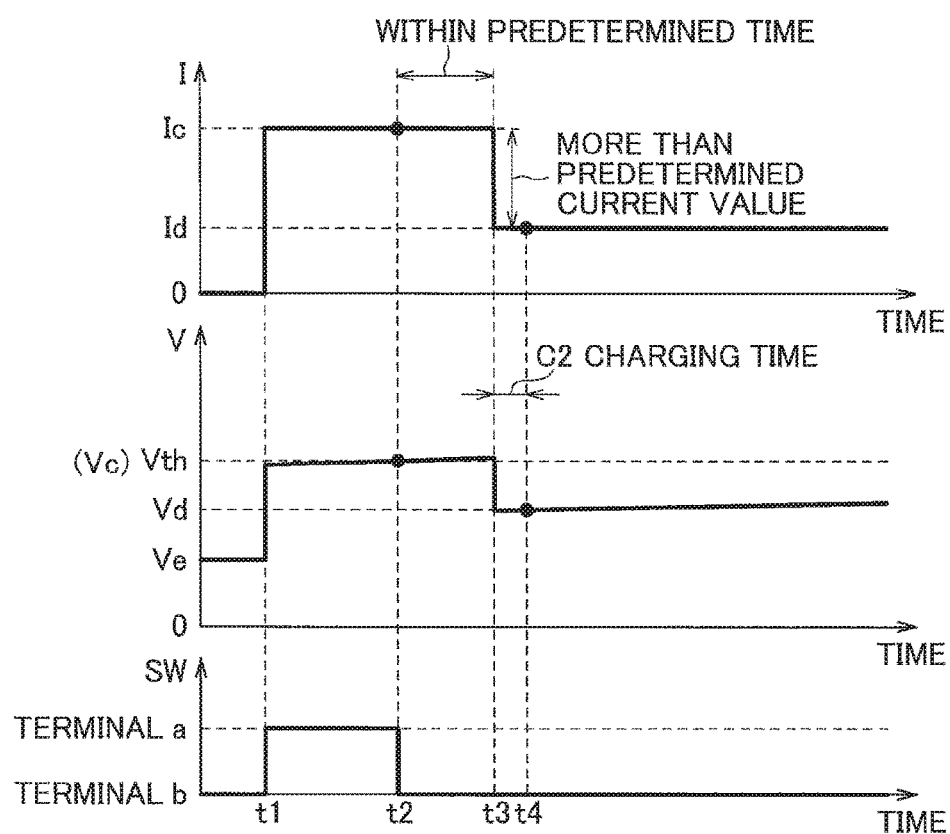
FIG. 4 is a waveform diagram of operation of the internal resistance calculating device shown in FIG. 1.

Next, the above-described internal resistance calculating operation will be explained with reference to the flowchart shown in FIG. 3 and to the waveform diagram shown in FIG. 4. The flowchart shown in FIG. 3 is mainly executed by the μCOM 30. It is assumed here that, before the execution of the flowchart, the terminal b and the terminal c of the switch SW are connected to each other.

Firstly, in step S101, the charging of the secondary battery B is started. In this step, a control signal indicative of the start of the charging is outputted to the charging unit 15, and the charging unit 15 starts the charging of the secondary battery B. Together with that, in step S102, the switch SW is switched such that the terminal a and the terminal c are connected to each other (time t1 in FIG. 4). At this time, the charge current flows through the secondary battery B, and the both-end voltage of the secondary battery B rises from the voltage value Ve caused by the electromotive force to near a potential obtained by adding the voltage drop Vr caused by the current flowing through the internal resistance r.

Next, in step S103, it is determined whether or not the both-end voltage V of the secondary battery B detected by the voltage measuring unit 22 has reached a predetermined threshold value voltage Vth as a first voltage value. If the both-end voltage V is not the threshold value voltage Vth ("No"), then the procedure waits in this step, and if the both-end voltage V has reached to the threshold value voltage Vth ("Yes"), then the procedure proceeds to a step S104, and the charge current value detected by the current measuring unit 21 is obtained. This threshold value voltage Vth is not limited to a specific value and may be a value having a range of about ±X %. This X % may arbitrarily be determined in view of how much the SOC may be deviated in terms of a relationship between a desired internal resistance value and the SOC. In general, if the above-mentioned ±X % is about ±5%, there is no significant difference in the detected resistance value. The charge current value obtained at this time is defined as Ic. That is, the charge current value Ic corresponds to the first current value. In step S105, the switch SW is switched such that the terminal b and the terminal c are connected to each other (time t2 in FIG. 4).

Next, in step 3106, it is determined whether or not predetermined time is elapsed after the switch SW is switched in step S105. If the predetermined time is elapsed ("Yes"), the procedure returns to step S102, and if the predetermined time is not elapsed ("No"), then the procedure proceeds to step S107, in which it is determined whether or not the charge current is decreased for a predetermined current value or more. If the charge current is not decreased for the predetermined current value or more ("No"), then the procedure returns to step S106, and if the charge current is decreased for the predetermined current value or more ("Yes"), then the procedure proceeds to step S108 (time t3 in FIG. 4). At this time, since the charge current is decreased, the both-end voltage value of the secondary battery B is also decreased.

The predetermined time is determined by accuracy of the capacitors C1 and C2 and of the differential amplifier 23, as well as by required accuracy of the finally calculated internal resistance value R. Generally, electric charge accumulated in the capacitor is discharged due to the leakage of current of the capacitor and the input impedance of the differential amplifier. As a result, the potential of the capacitor is changed, which has influence on the differential amplifier, and thus the absolute accuracy of the finally calculated internal resistance value R. Therefore, it is ideal that the predetermined time is determined such that Vc is not less than Vd when high accuracy is not required, or such that the predetermined time is slightly slower than the response speed of the battery when high accuracy is desired.

The predetermined current value is also determined by the required accuracy of the finally calculated internal resistance value R as in the case of the predetermined time. This is because, due to the detection resolution of the current measuring unit 21 to be used, a change that is smaller than that cannot be demanded. Therefore, it is ideal that, when high accuracy is not required, the predetermined current value is set to correspond to when the current change that is more than one resolution of the current measuring unit 21 is obtained, and, when high accuracy is desired, the predetermined current value is set to correspond to when the current change that can ignore the above-mentioned resolution is obtained. However, if the predetermined current value is set large, the predetermined time becomes long, thus it is preferable to take account of balances between the predetermined current value and the predetermined time when determining them.

Next, in step S108, it is determined whether or not the charging time of the capacitor C2 is elapsed after the decrease of the charge current is detected in step S107. If the charging time is not elapsed, the procedure waits in this step, and if the charging time is elapsed, the process proceeds to step S109, in which a charge current value detected by the current measuring unit 21 is obtained. The charging time is time that elapses before the voltage of the capacitor C2 becomes equal to the both-end voltage of the secondary battery B, and it can be a value predetermined by the capacity of the capacitor C2 and such. The charge current value obtained at this time is defined as Id (time t4 in FIG. 4). That is, the charge current value Id corresponds to a second current value.

Next, in step S110, output is obtained from the differential amplifier 23 through the third A/D 26. That is, a differential value is calculated. At the time when the switch SW is switched in step S105, Vc (=Vth) which is the both-end voltage value of the secondary battery B when the charge current value Ic is measured, is held in the capacitor C1. At step S109, Vd which is the both-end voltage value of the secondary battery B when the charge current Id is measured after the charging time of the capacitor C2 is elapsed, is held in capacitor C2. That is, the capacitor C1 corresponds to a first voltage holding unit, the both-end voltage value Vd corresponds to the second voltage value, and the capacitor C2 corresponds to a second voltage holding unit (i.e., a second voltage obtaining unit). Therefore, by obtaining the output of the differential amplifier 23 in step S110, it is possible to calculate the differential value (Vm=(Vc−Vd)× Av) of the both-end voltages of the secondary battery B when the charge current value Ic is measured and when the charge current Id is measured.

In step S111, the internal resistance value is calculated based on the charge currents Ic and Id obtained in steps S104 and S109, and based on the differential value Vm calculated (obtained) in step S110. That is, the internal resistance R is calculated as R=(Vc−Vd)/(Ic−Id)=Vm/(Ic−Id). Of course, this calculation is carried out with taking account of the amplification factor Av of the differential amplifier 23.

As described above, according to the above-described internal resistance calculating device 1, the voltage value Vc at the time of the first measurement of the charge current value Ic is defined as the predetermined threshold value voltage value Vth. Thus, the measurements can be made with the constant SOC. It is known that a correlation exists between the SOC and the battery terminal voltage (i.e., the both-end voltage), thus, by carrying out the measurements with the constant SOC, the variation in the internal resistances due to the SOC can be prevented. Furthermore, there is no need to temporarily interrupt the charging to calculate the internal resistance, and the timing of the calculation of the internal resistance will generate naturally and automatically at the time of the charging of the secondary battery B in the EV or the HEV, for example.

Furthermore, as described above, the differential amplifier 23 can calculate the differential between the voltage value Vc and the voltage value Vd, and can amplify that differential value by a required amplification factor Av. Thus, the difference between the voltage value Vc and the voltage value Vd can be detected even if it is very small. Consequently, there is no need to take measures for reduced noise, and also an AD converter of high resolution and such is not required.

Furthermore, as described above, the voltage value Vc and the voltage value Vd are held in the two capacitors C1 and C2 hold by switching the switch SW. Consequently, the voltage value Vc and the voltage value Vd can be obtained without being influenced from the cell voltage of the secondary battery B.

Furthermore, as described above, the voltage value Vd is held after the charging time of the capacitor C2 is elapsed, and the charge current value Id at that time is measured. Thus, the procedure waits until the potential of the capacitor C2 becomes equal to the voltage that is the same as the both-end voltage value of the secondary battery B. Thus, the voltage value Vd and the charge current value Id can be measured with high accuracy.

Second Embodiment

Figure 5:
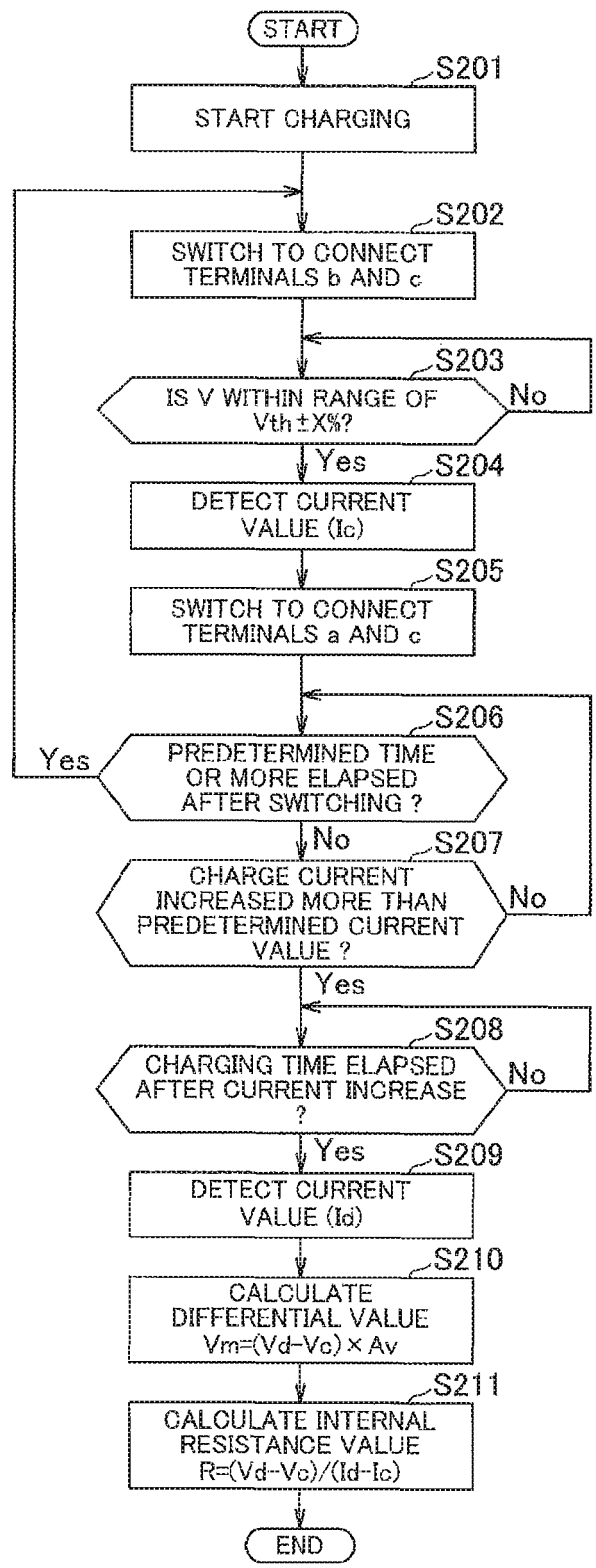
FIG. 5 is a flowchart of operation of an internal resistance calculating device according to a second embodiment of the invention.
Figure 6:
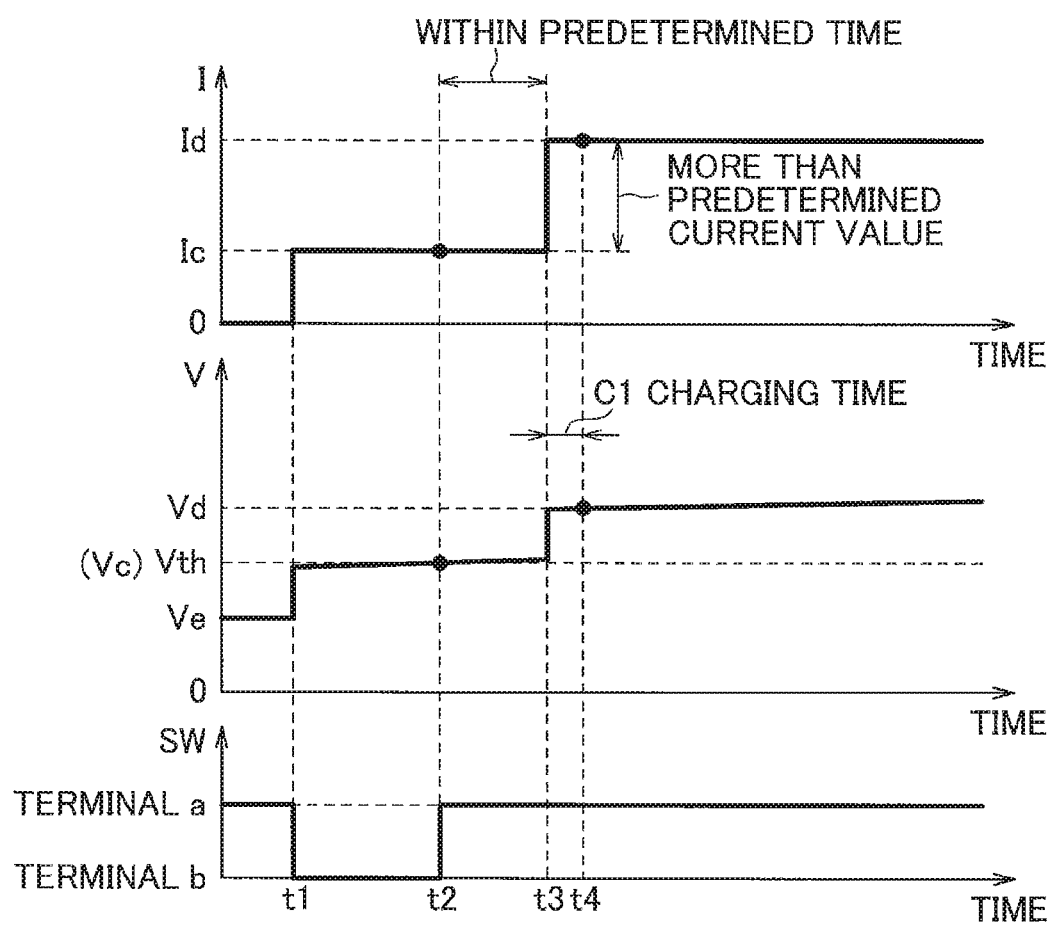
FIG. 6 is a waveform diagram of operation of the internal resistance calculating device according to the second embodiment of the invention.

Next, a second embodiment of the present invention will be described with reference to FIGS. 5 and 6. The same reference signs are allocated to the same elements as those of the above-described first embodiment to omit the explanation thereof.

In this embodiment, the general configuration is similar to that shown in FIG. 1, but a calculating method of the internal resistance is different from the first embodiment. In this embodiment, if the voltage drops during the charging with different charge current values Ic and Id are defined as Vrc and Vrd, respectively, then, when Ic<Id, there is provided Vrc<Vrd. Here, if both-end voltage value of a secondary battery B with the voltage drop Vrc is defined as Vc, and both-end voltage value of the secondary battery B with the voltage drop Vrd is defined as Vd, then, since Vc=Ve+Vrc and Vd=Ve+Vrd, there is provided Vd−Vc=Vrd−Vrc. Thus, by inputting the both-end voltages of the secondary battery B to the differential amplifier 23, Vrd−Vrc can be obtained.

Next, the above-described internal resistance calculating operation will be explained with reference to the flowchart shown in FIG. 5 and to the waveform diagram shown in FIG. 6. The flowchart shown in FIG. 5 is mainly executed by the μCOM 30. It is assumed here that, before the execution of the flowchart, the terminal a and the terminal c of the switch SW are connected to each other.

Firstly, in step S201, the charging of the secondary battery B is started. In this step, a control signal indicative of the start of the charging is outputted to the charging unit 15, and the charging unit 15 starts the charging of the secondary battery B. Together with that, in step S202, the switch SW is switched such that the terminal b and the terminal c are connected to each other (time t1 in FIG. 6). At this time, the charge current flows through the secondary battery B, and the both-end voltage of the secondary battery B rises from the voltage value Ve caused by the electromotive force to near a potential obtained by adding the voltage drop Vr caused by the current flowing through the internal resistance r.

Next, in step S203, it is determined whether or not the both-end voltage V of the secondary battery B detected by the voltage measuring unit 22 has reached a predetermined threshold value voltage Vth. If the both-end voltage V is not the threshold value voltage Vth ("No"), then the procedure waits in this step, and if the both-end voltage V has reached to the threshold value voltage Vth ("Yes"), then the procedure proceeds to a step S204, in which the charge current value detected by the current measuring unit 21 is obtained. This threshold value voltage Vth is not limited to a specific value and may be a value having a range of about ±X %. The charge current value obtained at this time is defined as Ic. In step S205, the switch SW is switched such that the terminal a and the terminal c are connected to each other (time t2 in FIG. 6).

Next, in step S206, it is determined whether or not predetermined time is elapsed after the switch SW is switched in step S205. If the predetermined time is elapsed ("Yes"), the procedure returns to step S202, and if the predetermined time is not elapsed ("No"), then the procedure proceeds to step S207, in which it is determined whether or not the charge current is increased for a predetermined current value or more. If the charge current is not increased for the predetermined current value or more ("No"), then the procedure returns to step S206, and if the charge current is increased for the predetermined current value or more ("Yes"), then the procedure proceeds to step S208 (time t3 in FIG. 6). At this time, since the charge current is increased, the both-end voltage value of the secondary battery B is also increased.

Next, in step S208, it is determined whether or not the charging time of the capacitor C1 is elapsed, after the increase in the charge current is detected in step S207. If the charging time is not elapsed, the procedure waits in this step, and if the charging time is elapsed, the process proceeds to step S209, in which a charge current value detected by the current measuring unit 21 is obtained. The charging time is time that elapses before the voltage of the capacitor C1 becomes equal to the both-end voltage of the secondary battery B, and it can be a value predetermined by the capacity of the capacitor C1 and such. The charge current value obtained at this time is defined as Id (time t4 in FIG. 6).

Next, in step S210, output is obtained from the differential amplifier 23 through the third A/D 26. That is, a differential value is calculated. At the time when the switch SW is switched in step S205, Vc (=Vth) which is the both-end voltage value of the secondary battery B when the charge current value Ic is measured, is held in the capacitor C2. At step S209, Vd which is the both-end voltage value of the secondary battery B when the charge current Id is measured, is held in capacitor C1. Therefore, by obtaining the output of the differential amplifier 23 in step S210, it is possible to calculate the differential value (Vm=(Vd−Vc)×Av) of the both-end voltages of the secondary battery B when the charge current value Ic is measured and when the charge current Id is measured.

In step S2111, the internal resistance value is calculated based on the charge currents Ic and Id obtained in steps S204 and S209, and based on the differential value Vm calculated (obtained) in step S210. That is, the internal resistance R is calculated as R=(Vd−Vc)/(Id−Ic)=Vm/(Id−Ic). Of course, this calculation is carried out with taking account of the amplification factor Av of the differential amplifier 23.

As described above, according to this embodiment, the voltage value Vc at the time of the first measurement of the charge current value Ic is defined as the predetermined threshold value voltage value Vth. Thus, the measurements can be made with the constant SOC. Furthermore, there is no need to temporarily interrupt the charging to calculate the internal resistance, and the timing of the calculation of the internal resistance will generate naturally and automatically at the time of the charging of the secondary battery B in the EV or the HEV, for example.

Third Embodiment

Next, a third embodiment of the present invention will be described with reference to FIGS. 7 to 10. The same reference signs are allocated to the same elements as those of the above-described first and second embodiments to omit the explanation thereof.

Figure 7:
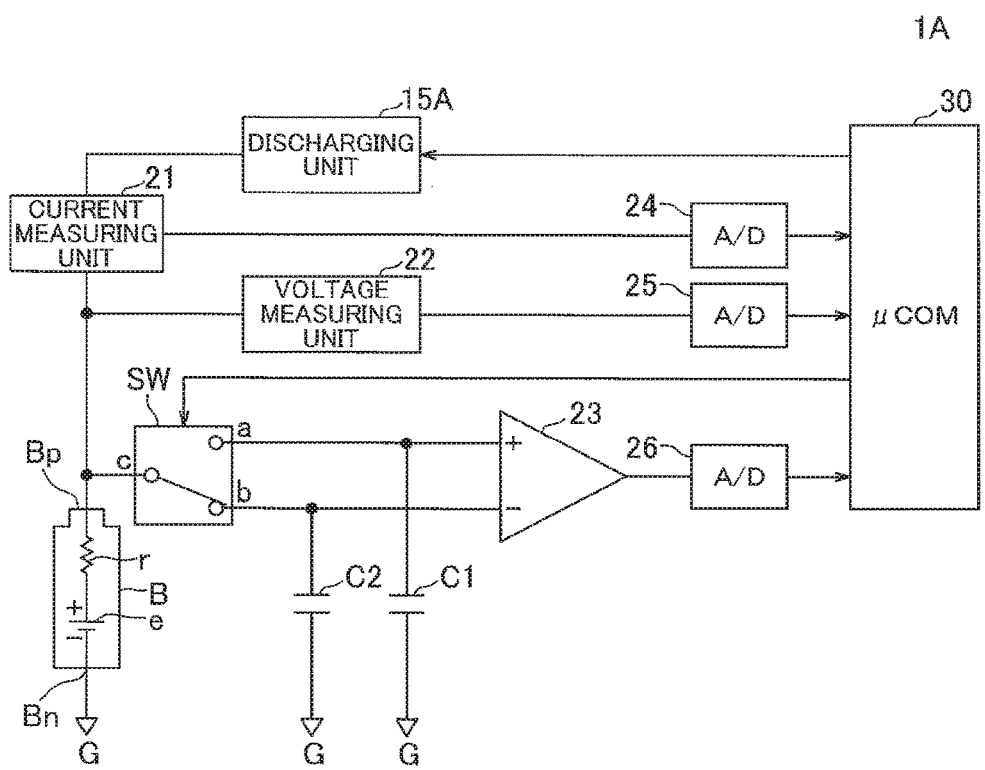
FIG. 7 is a schematic block diagram of an internal resistance calculating device according to a third embodiment of the invention.

An internal resistance calculating device 1A of the third embodiment shown in FIG. 7 is different from the internal resistance calculating device 1 shown in FIG. 1 in that a discharging unit 15A is provide in place of the charging unit 15. The discharging unit 15A includes a pair of output terminals connected to the positive electrode Bp and the negative electrode Bn of the secondary battery B, respectively. The discharging unit 15A is controlled by the later-described μCOM 30, thereby discharging the secondary battery B with a predetermined discharge current. That is, the discharging unit functions as a charging/discharging unit for discharging the secondary battery B.

Figure 8:
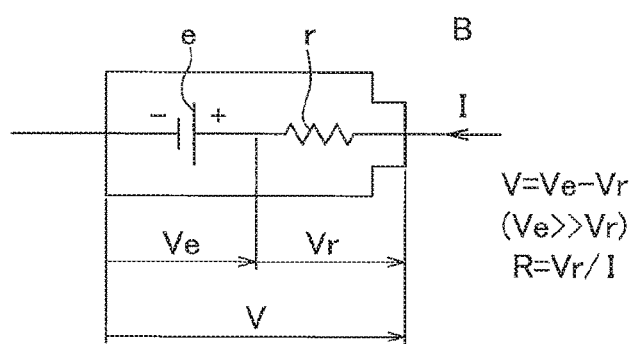
FIG. 8 is an explanatory diagram showing a relationship between a both-end voltage of a secondary battery shown in FIG. 7, an electromotive force and internal resistance.

As shown in FIG. 8, the secondary battery B generates a voltage V between both electrodes (i.e., the positive electrode Bp and the negative electrode Bn). When the secondary battery B is discharged with current I, the voltage V is the difference between a voltage value (i.e., a cell voltage) Ve generated by electromotive force caused by the electromotive force portion e, and a voltage value (i.e., a voltage drop) Vr generated when the current flows through the internal resistance r (thus, V=Ve−Vr). Thus, if the current I is changed, the voltage drop Vr is also changed (i.e., Vr=R×I, R is an internal resistance value).

If the voltage drops during the discharging with different discharge current values Ic and Id are defined as Vrc and Vrd, respectively, then, when Ic>Id, there is provided Vrc>Vrd. If both-end voltage value of the secondary battery B with the voltage drop Vrc is defined as Vc, and the both-end voltage value of the secondary battery B with the voltage drop Vrd is defined as Vd, then, since Vc=Ve−Vrc and Vd=Ve−Vrd, there is provided Vd−Vc=Vrc−Vrd. Thus, by inputting the both-end voltages of the secondary battery B to the differential amplifier 23, Vrc−Vrd can be obtained.

Figure 9:
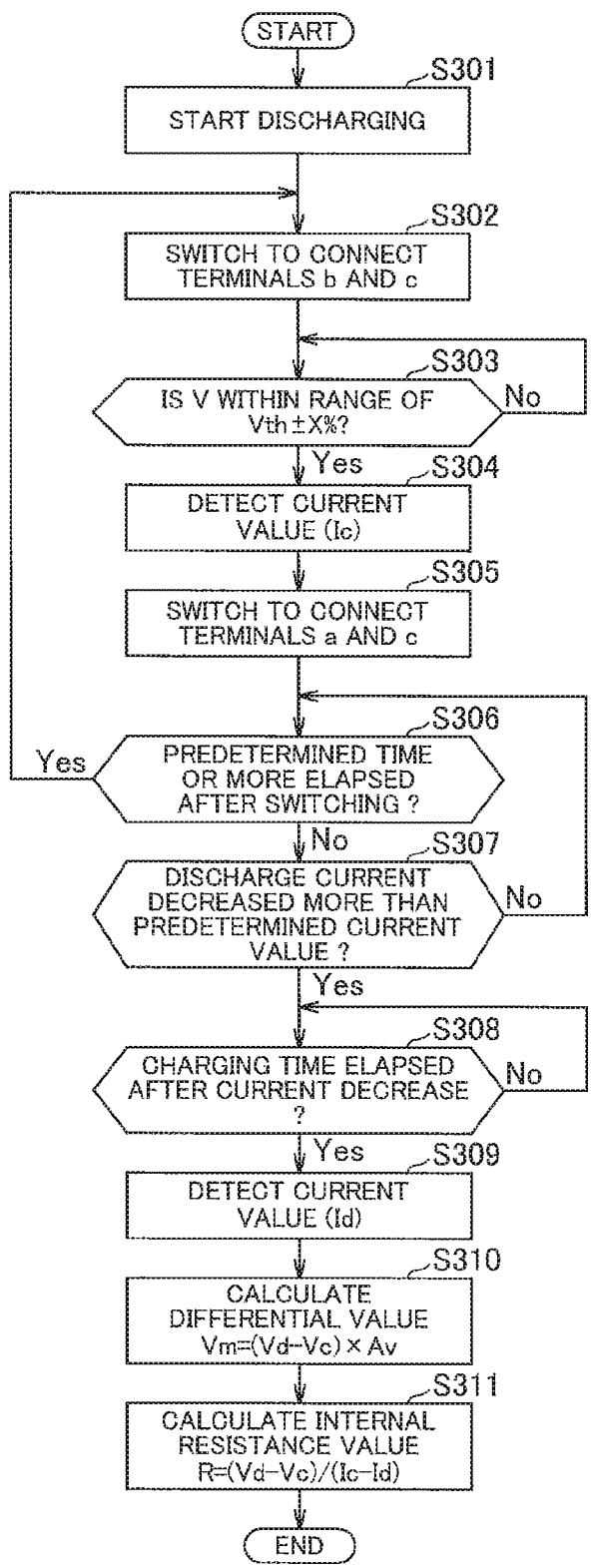
FIG. 9 is a flowchart of operation of the internal resistance calculating device shown in FIG. 7.
Figure 10:
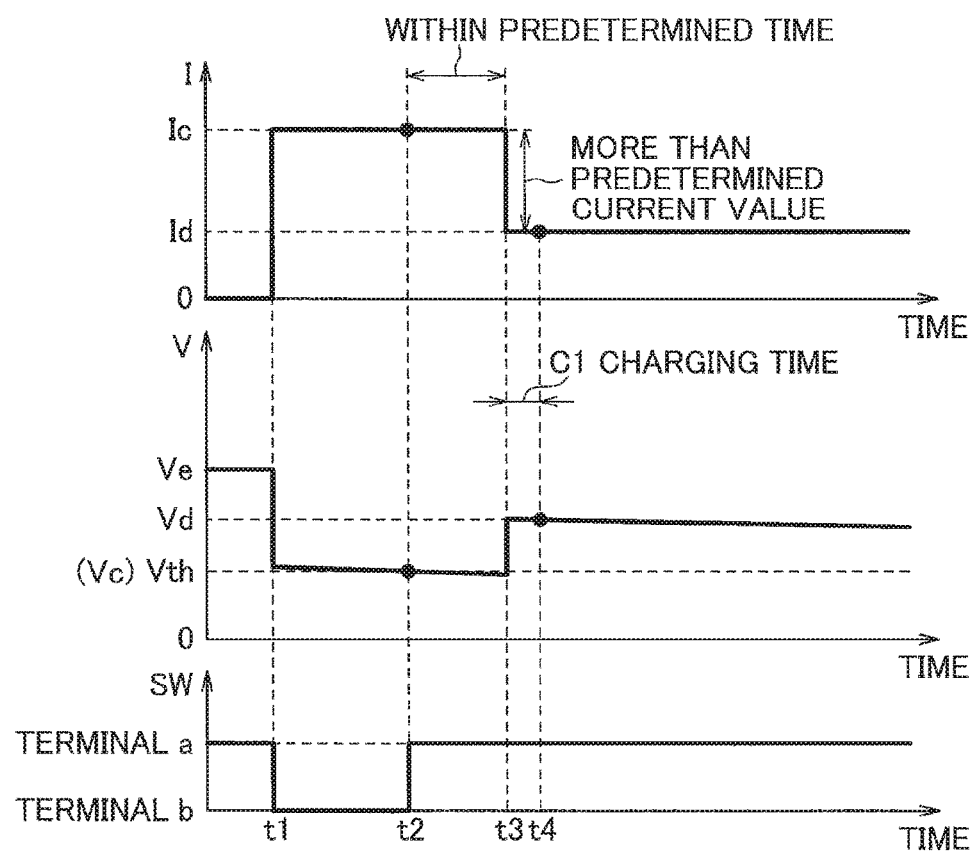
FIG. 10 is a waveform diagram of operation of the internal resistance calculating device shown in FIG. 7.

Next, the above-described internal resistance calculating operation will be explained with reference to the flowchart shown in FIG. 9 and to the waveform diagram shown in FIG. 10. The flowchart shown in FIG. 9 is mainly executed by the μCOM 30. It is assumed here that, before the execution of the flowchart, the terminal a and the terminal c of the switch SW are connected to each other.

Firstly, in step S301, the discharging of the secondary battery B is started. In this step, a control signal indicative of the start of the discharging is outputted to the discharging unit 15A, and the discharging unit 15A starts the discharging of the secondary battery B. Together with that, in step S302, the switch SW is switched such that the terminal b and the terminal c are connected to each other (time t1 in FIG. 10). At this time, the discharge current flows through the secondary battery B, and the both-end voltage of the secondary battery B drops from the voltage value Ve caused by the electromotive force to near a potential obtained by subtracting the voltage drop Vr caused by the current flowing through the internal resistance r.

Next, in step S303, it is determined whether or not the both-end voltage V of the secondary battery B detected by the voltage measuring unit 22 has reached a predetermined threshold value voltage Vth. If the both-end voltage V is not the threshold value voltage Vth ("No"), then the procedure waits in this step, and if the both-end voltage V has reached to the threshold value voltage Vth ("Yes"), then the procedure proceeds to a step S304, in which the discharge current value detected by the current measuring unit 21 is obtained. This threshold value voltage Vth is not limited to a specific value and may be a value having a range of about ±X %. The discharge current value obtained at this time is defined as Ic. In step S305, the switch SW is switched such that the terminal a and the terminal c are connected to each other (time t2 in FIG. 10).

Next, in step S306, it is determined whether or not predetermined time is elapsed after the switch SW is switched in step S305. If the predetermined time is elapsed ("Yes"), the procedure returns to step S302, and if the predetermined time is not elapsed ("No"), then the procedure proceeds to step S307, in which it is determined whether or not the discharge current is decreased for a predetermined current value or more. If the discharge current is not decreased for the predetermined current value or more ("No"), then the procedure returns to step S306, and if the discharge current is decreased for the predetermined current value or more ("Yes"), then the procedure proceeds to step S308 (time t3 in FIG. 10). At this time, since the discharge current is decreased, the both-end voltage value of the secondary battery B is increased.

Next, in step S308, it is determined whether or not the charging time of the capacitor C1 is elapsed, after the decrease in the discharge current is detected in step S307. If the charging time is not elapsed, the procedure waits in this step, and if the charging time is elapsed, the process proceeds to step S309, in which a discharge current value detected by the current measuring unit 21 is obtained. The charging time is time that elapses before the voltage of the capacitor C1 becomes equal to the both-end voltage of the secondary battery B, and it can be a value predetermined by the capacity of the capacitor C1 and such. The discharge current value obtained at this time is defined as Id (time t4 in FIG. 10).

Next, in step S310, output is obtained from the differential amplifier 23 through the third A/D 26. That is, a differential value is calculated. At the time when the switch SW is switched in step S305, Vc (=Vth) which is the both-end voltage value of the secondary battery B when the discharge current value Ic is measured, is held in the capacitor C2. At step S309, Vd which is the both-end voltage value of the secondary battery B when the discharge current Id is measured, is held in capacitor C1. Therefore, by obtaining the output of the differential amplifier 23 in step S310, it is possible to calculate the differential value (VM=(Vd−Vc)× Av) of the both-end voltages of the secondary battery B when the discharge current value Ic is measured and when the discharge current Id is measured.

In step S311, the internal resistance value is calculated based on the discharge currents Ic and Id obtained in steps S304 and S309, and based on the differential value Vm calculated. (obtained) in step S310. That is, the internal resistance R is calculated as R=(Vd−Vc)/(Id−Ic)=Vm/(Id−Ic). Of course, this calculation is carried out with taking account of the amplification factor Av of the differential amplifier 23.

As described above, according to this embodiment, the voltage value Vc at the time of the first measurement of the discharge current value Ic is defined as the predetermined threshold value voltage value Vth. Thus, the can be made with the constant SOC. Furthermore, there is no need to temporarily interrupt the discharging to calculate the internal resistance, and the timing of the calculation of the internal resistance will generate naturally and automatically at the time of the discharging of the secondary battery B in the EV or the HEV, for example.

Fourth Embodiment

Figure 11:
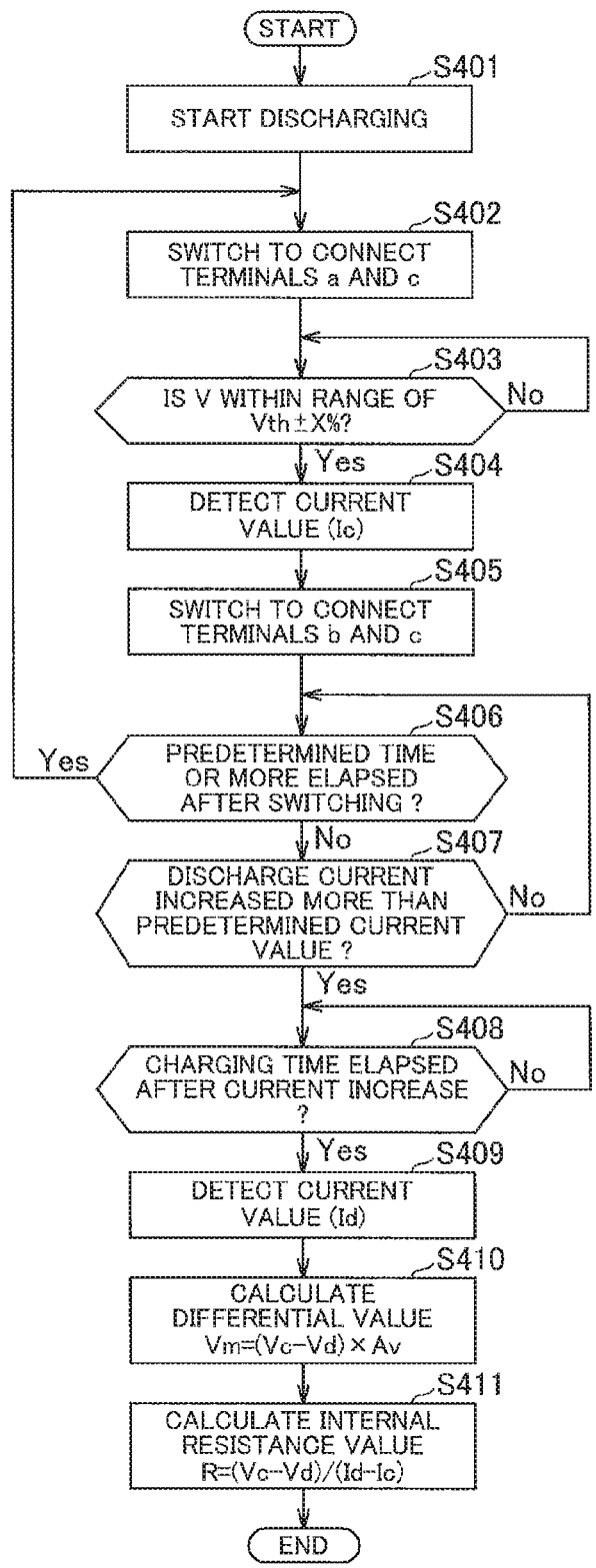
FIG. 11 is a flowchart of operation of an internal resistance calculating device according to a fourth embodiment of the invention.
Figure 12:
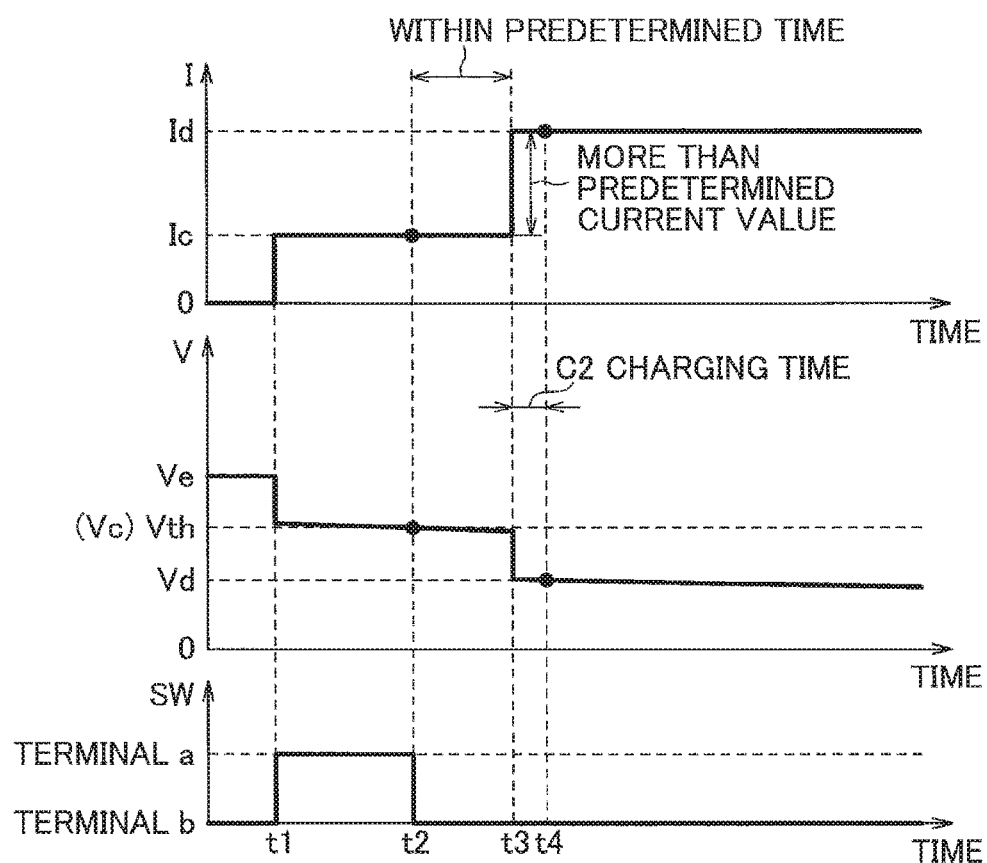
FIG. 12 is a waveform diagram of operation of the internal resistance calculating device according to the fourth embodiment of the invention.

Next, a fourth embodiment of the present invention will be described with reference to FIGS. 11 and 12. The same reference signs are allocated to the same members and elements as those of the above-described first to third embodiments to omit explanation thereof.

A general configuration of the fourth embodiment is the same as that shown in FIG. 7, but the calculating method of the internal resistance is different from that of the third embodiment. In the fourth embodiment, if the voltage drops during the discharging with different discharge current values Ic and Id are defined as Vrc and Vrd, respectively, then, when there is provided Vrc<Vrd. If both-end voltage value of the secondary battery B with the voltage drop Vrc is defined as Vc, and the both-end voltage value of the secondary battery B with the voltage drop Vrd is defined as Vd, then, since Vc=Ve−Vrc and Vd=Vc−Vrd, there is provided Vc−Vd=Vrd−Vrc. Thus, by inputting the both-end voltages of the secondary battery B to the differential amplifier 23, Vrd−Vrc can be obtained.

Next, the above-described internal resistance calculating operation will be explained with reference to the flowchart shown in FIG. 11 and to the waveform diagram shown in FIG. 12. The flowchart shown in FIG. 11 is mainly executed by the μCOM 30. It is assumed here that, before the execution of the flowchart, the terminal b and the terminal c of the switch SW are connected to each other.

Firstly, in step S401, the discharging of the secondary battery B is started. In this step, a control signal indicative of the start of the discharging is outputted to the discharging unit 15A, and the discharging unit 15A starts the discharging of the secondary battery B. Together with that, in step S402, the switch SW is switched such that the terminal a and the terminal c are connected to each other (time t1 in FIG. 12). At this time, the discharge current flows through the secondary battery B, and the both-end voltage of the secondary battery B drops from the voltage value Ve caused by the electromotive force to near a potential obtained by subtracting the voltage drop Vr caused by the current flowing through the internal resistance r.

Next, in step S403, it is determined whether or not the both-end voltage V of the secondary battery B detected by the voltage measuring unit 22 has reached a predetermined threshold value voltage Vth. If the both-end voltage V is not the threshold value voltage Vth ("No"), then the procedure waits in this step, and if the both-end voltage V has reached to the threshold value voltage Vth ("Yes"), then the procedure proceeds to a step S404, in which the discharge current value detected by the current measuring unit 21 is obtained. This threshold value voltage Vth is not limited to a specific value and may be a value having a range of about ±X %. The discharge current value obtained at this time is defined as Ic. In step S405, the switch SW is switched such that the terminal b and the terminal c are connected to each other (time t2 in FIG. 12).

Next, in step S406, it is determined whether or not predetermined time is elapsed after the switch SW is switched in step S405. If the predetermined time is elapsed ("Yes"), the procedure returns to step S402, and if the predetermined time is not elapsed ("No"), then the procedure proceeds to step S407, in which it is determined whether or not the discharge current is increased for a predetermined current value or more. If the discharge current is not increased for the predetermined current value or more ("No"), then the procedure returns to step S406, and if the discharge current is increased for the predetermined current value or more ("Yes"), then the procedure proceeds to step S408 (time t3 in FIG. 12). At this time, since the discharge current is increased, the both-end voltage value of the secondary battery B is dropped.

Next, in step S408, it is determined whether or not the charging time of the capacitor C2 is elapsed after the increase in the discharge current is detected in step S407. If the charging time is not elapsed, the procedure waits in this step, and if the charging time is elapsed, the process proceeds to step S409, in which a discharge current value detected by the current measuring unit 21 is obtained. The charging time is time that elapses before the voltage of the capacitor C2 becomes equal to the both-end voltage of the secondary battery B, and it can be a value predetermined by the capacity of the capacitor C2 and such. The discharge current value obtained at this time is defined as Id (time t4 in FIG. 12).

Next, in step S410, output is obtained from the differential amplifier 23 through the third A/D 26. That is, a differential value is calculated. At the time when the switch SW is switched in step S405, Vc (=Vth) which is the both-end voltage value of the secondary battery B when the discharge current value Ic is measured, is held in the capacitor C1. At step S409, Vd which is the both-end voltage value of the secondary battery B when the discharge current Id is measured, is held in capacitor C2. Therefore, by obtaining the output of the differential amplifier 23 in step S410, it is possible to calculate the differential value (Vm=(Vc−Vd)× Av) of the both-end voltages of the secondary battery B when the discharge current value Ic is measured and when the discharge current Id is measured.

In step S411, the internal resistance value is calculated based on the discharge currents Ic and Id obtained in steps S404 and S409, and based on the differential value Vm calculated (obtained) in step S410. That is, the internal resistance R is calculated as R=(Vc−Vd)/(Id−Ic)=Vm/(Id−Ic). Of course, this calculation is carried out with taking account of the amplification factor Av of the differential amplifier 23.

As described above, according to this embodiment, the voltage value Vc at the time of the first measurement of the discharge current value Ic is defined as the predetermined threshold value voltage value Vth. Thus, the measurements can be made with the constant SOC. Furthermore, there is no need to temporarily interrupt the discharging to calculate the internal resistance, and the timing of the calculation of the internal resistance will generate naturally and automatically at the time of the discharging of the secondary battery B in the EV or the HEV, for example.

In the above-described first to fourth embodiments, the both-end voltage value Vc of the secondary battery B when the charge (discharge) current Ic is measured, and the both-end voltage value Vd of the secondary battery B when the charge (discharge) current Id is measured, are held in the capacitors C1 or C2. However, the present invention is not limited to this, and the capacitor for holding the both-end voltage value Vd may be omitted. In the case of not providing the capacitor for holding the both-end voltage value Vd, the switch SW may be switched, after a certain time is elapsed, such that the both-end voltage value of the secondary battery B is inputted to the input terminal of the differential amplifier 23 at which this capacitor is omitted, and the differential value Vm may be calculated by providing Vd to be the both-end voltage value of the secondary battery B at the time when another certain time is elapsed.

Fifth Embodiment

Next, a fifth embodiment of the present invention will be described with reference to FIGS. 13 and 15B. The same reference signs are allocated to the same elements as those of the above-described first to fourth embodiments to omit explanation thereof.

The fifth embodiment is a combination of the first to fourth embodiments, in which the internal resistance can be calculated in both cases of charging and discharging, and in both cases of the increase and decrease in the current.

Figure 13:
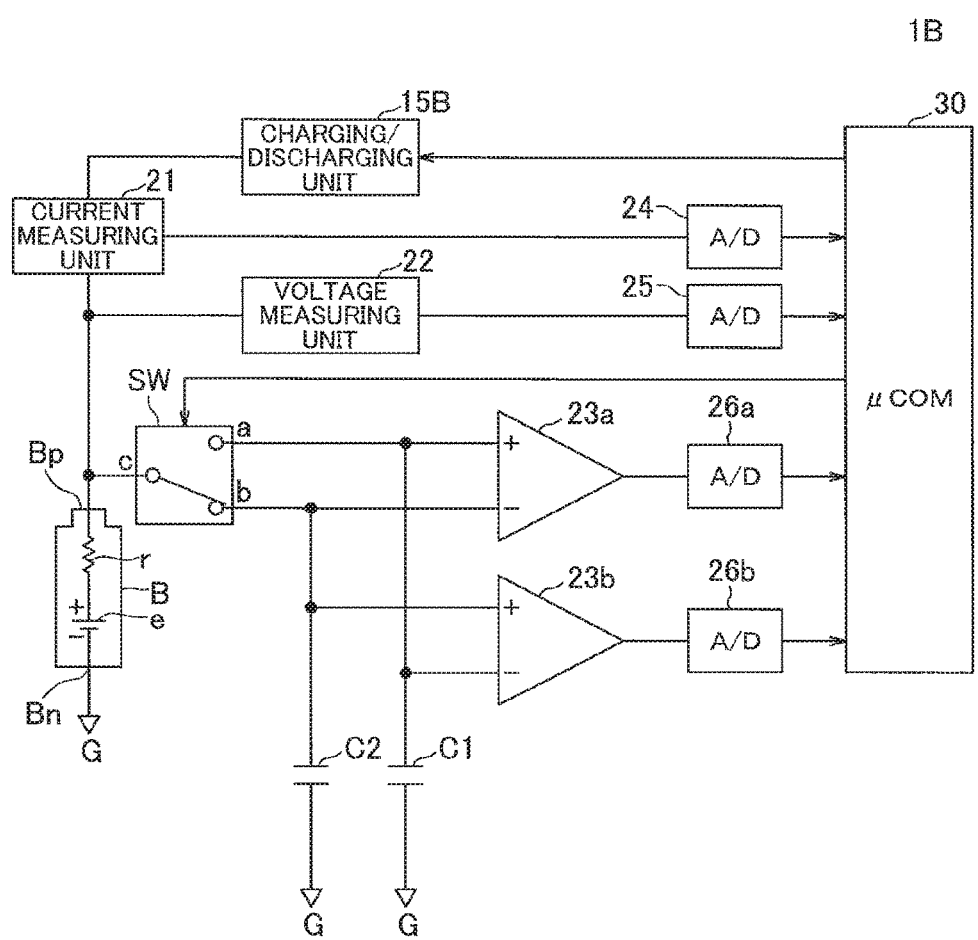
FIG. 13 is a schematic block diagram of an internal resistance calculating device according to a fifth embodiment of the invention.

FIG. 13 shows a schematic diagram of an internal resistance calculating device 1B according to the fifth embodiment. The internal resistance calculating device is includes a charging/discharging unit 15, a current measuring unit 21, a voltage measuring unit 22, differential amplifiers 23a, 23b, a first analogue-to-digital converter 24, a second analogue-to-digital converter 25, a third analogue-to-digital converter 26a, a fourth analogue-to-digital converter 26b, a μCOM 30, a switch SW, and capacitors C1 and C2.

Among the elements shown in FIG. 13, the current measuring unit 21, the voltage measuring unit 22, the first analogue-to-digital converter 24, the second analogue-to-digital converter 25, the μCOM 30, the switch SW and the capacitors C1 and C2 are the same as those shown in FIGS. 1 and 7.

The charging/discharging unit 15B has a function of the charging unit 15 and a function of the discharging unit 15A. That is, the charging/discharging unit 15B charges or discharges the secondary battery.

In the fifth embodiment, two differential amplifiers (23a and 23b) are provided, and these two differential amplifiers have functions to calculate a difference between the both-end voltage value of the secondary battery B held in the capacitor C1 and the both-end voltage value of the secondary battery B held in the capacitor C2, amplify the resultant by the amplification factor Av, and output the same, as similar to the above-described embodiments.

A + input terminal (i.e., a non-inverting input terminal) of the differential amplifier 23a is connected to the a-terminal of the switch SW and to the one side of the capacitor C1. A − input terminal (i.e., an inverting input terminal) of the differential amplifier 23a is connected to the b-terminal of the switch SW and to the one side of the capacitor C2. A + input terminal (i.e., a non-inverting input terminal) of the differential amplifier 23b is connected to the b-terminal of the switch SW and to the one side of the capacitor C2. A − input terminal (i.e., an inverting input terminal) of the differential amplifier 23b is connected to the a-terminal of the switch SW and to the one side of the capacitor C1.

The third analogue-to-digital converter 26a (hereinafter called "third A/D 26a") guantizes a differential signal outputted from the differential amplifier 23a, and outputs a signal indicative of a digital value corresponding to this differential signal.

The fourth analogue-to-digital converter 26b (hereinafter called, "fourth A/D 26b",) quantizes a differential signal outputted from the differential amplifier 23b, and outputs a signal indicative of a digital value corresponding to this differential signal.

Figure 14:
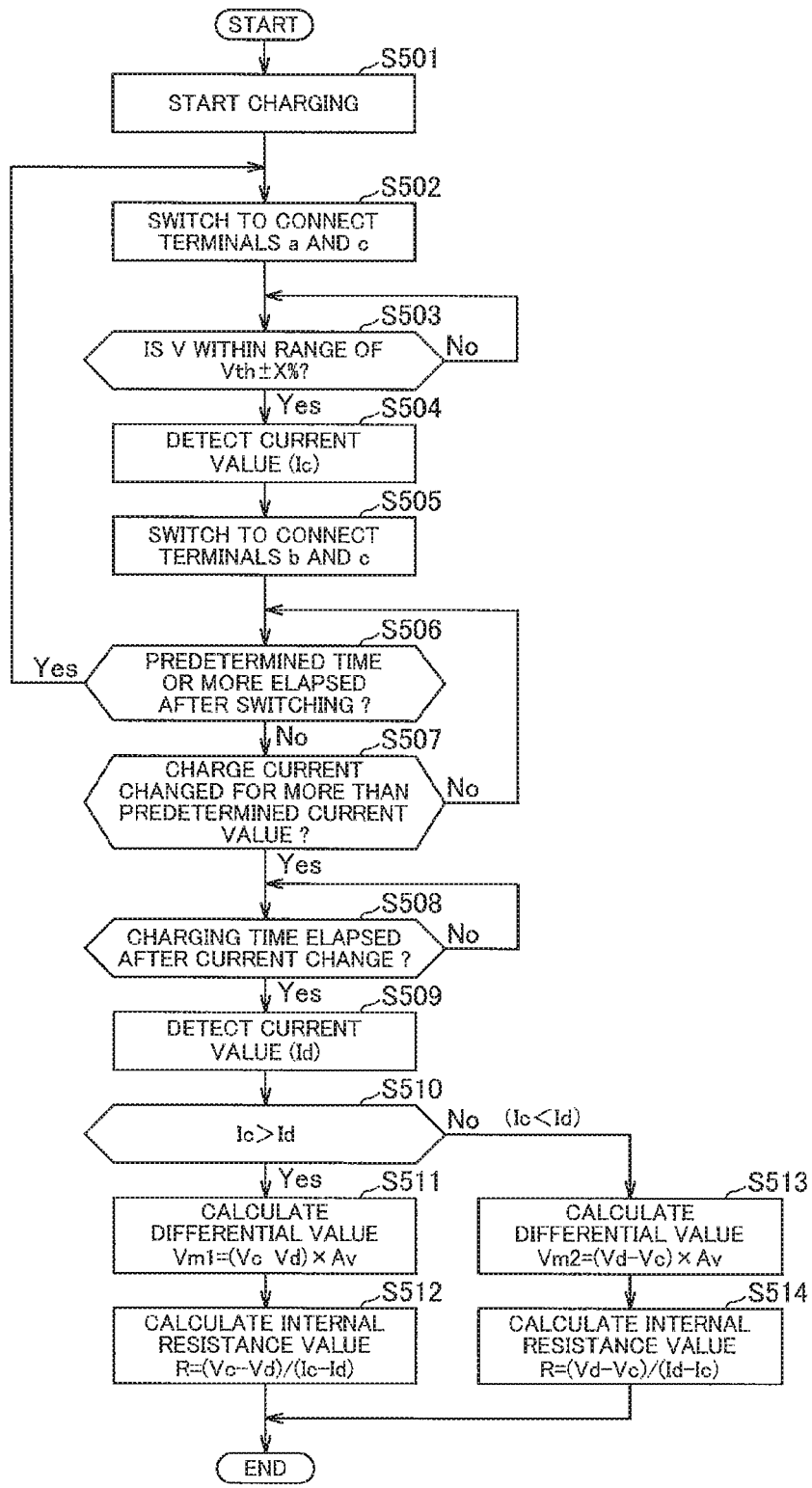
FIG. 14 is a flowchart of operation of the internal resistance calculating device shown in FIG. 13.
Figure 15:
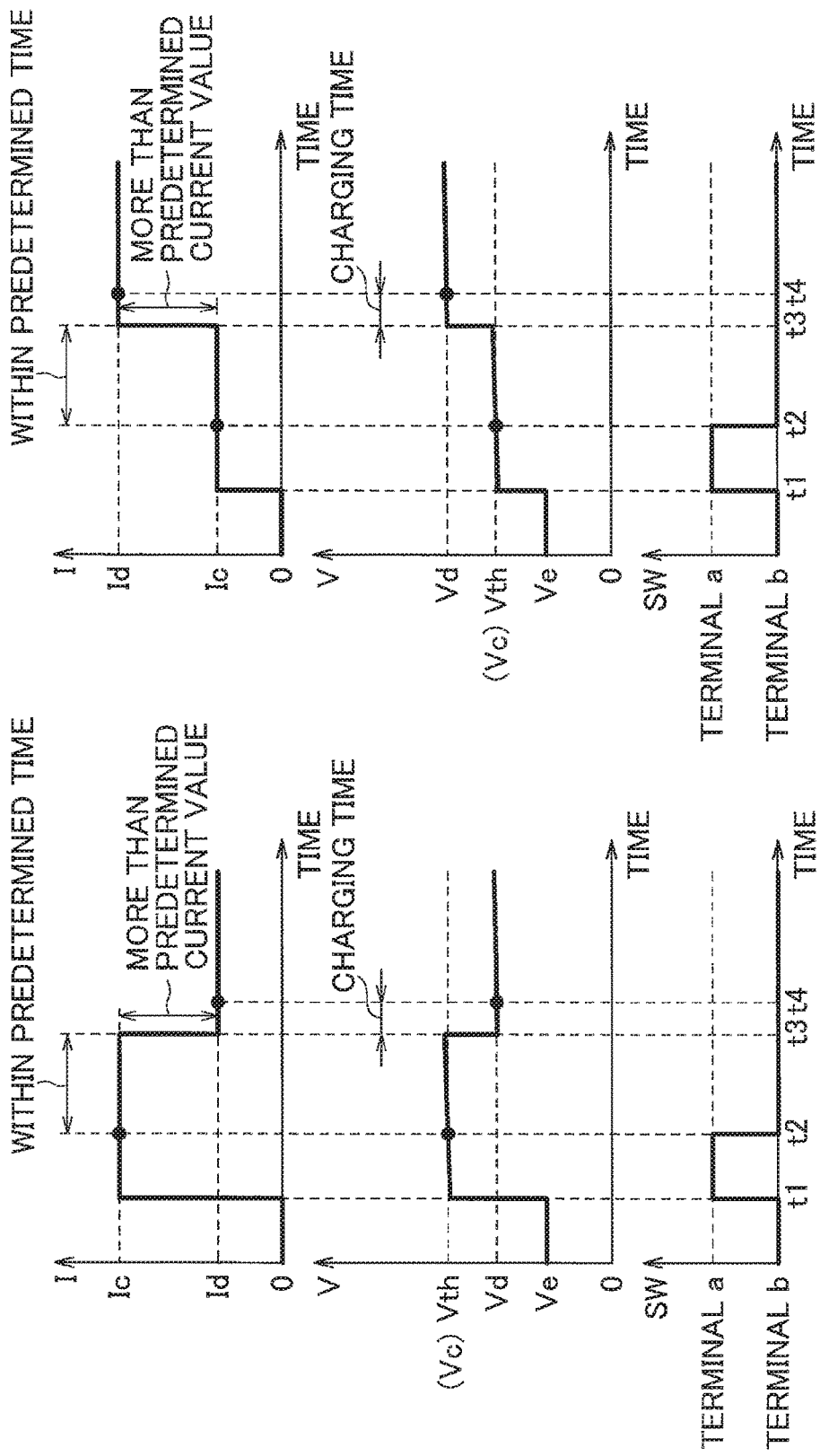
FIGS. 15A and 15B are waveform diagrams of operation of the internal resistance calculating device shown in FIG. 13.

Next, the above-described internal resistance calculating operation of the internal resistance calculating device 1B will be explained with reference to the flowchart shown in FIG. 14 and to the waveform diagram shown in FIG. 15. The flowchart shown in FIG. 14 is mainly executed by the μCOM 30. FIG. 14 is a flowchart showing an operation during the charging. It is assumed here that, before the execution of the flowchart, the terminal a and the terminal c of the switch SW are connected to each other.

Firstly, in step S501, the charging of the secondary battery B is started. In this step, a control signal indicative of the start of the charging is outputted to the charging/discharging unit 15B, and the charging/discharging unit 15B starts the charging of the secondary battery B. Together with that, in step S502, the switch SW is switched such that the terminal a and the terminal c are connected to each other (time t1 in FIGS. 15A, 15B). At this time, the charge current flows through the secondary battery B, and the both-end voltage of the secondary battery B rises from the voltage value Ve caused by the electromotive force to near a potential obtained by adding the voltage drop Vr caused by the current flowing through the internal resistance r.

Next, in step S503, it is determined whether or not the both-end voltage V of the secondary battery B detected by the voltage measuring unit 22 has reached a predetermined threshold value voltage Vth. If the both-end voltage V is not the threshold value voltage Vth ("No"), then the procedure waits in this step, and if the both-end voltage V has reached to the threshold value voltage Vth ("Yes"), then the procedure proceeds to a step S504, in which the charge current value detected by the current measuring unit 21 is obtained. This threshold value voltage Vth is not limited to a specific value and may be a value having a range of about ±X %. The charge current value obtained at this time is defined as Ic. In step S505, the switch SW is switched such that the terminal b and the terminal c are connected to each other (time t2 in FIGS. 15A, 15B).

Next, in step S506, it is determined whether or not predetermined time is elapsed after the switch SW is switched in step S505. If the predetermined time is elapsed ("Yes"), the procedure returns to step S502, and if the predetermined time is not elapsed ("No"), then the procedure proceeds to step S507, in which it is determined whether or not the charge current is changed for a predetermined current value or more. If the charge current is not changed for the predetermined current value or more ("No"), then the procedure returns to step S506, and if the charge current is changed for the predetermined current value or more ("Yes"), then the procedure proceeds to step S508. Here, when the charge current is changed so as to be decreased, the both-end voltage value of the secondary battery B is dropped (time t3 in FIG. 15A), and when the charge current is changed so as to be increased, the both-end voltage value of the secondary battery B is raised (time t3 in FIG. 15B).

Next, in step S508, it is determined whether or not the charging time of the capacitor C2 is elapsed after the change of the charge current is detected in step S507. If the charging time is not elapsed, the procedure waits in this step, and if the charging time is elapsed, the process proceeds to step S509, in which a charge current value detected by the current measuring unit 21 is obtained. The charging time is time that elapses before the voltage of the capacitor C2 becomes equal to the both-end voltage of the secondary battery B, and it can be a value predetermined by the capacity of the capacitor C2 and such. The charge current value obtained at this time is defined as Id (time t4 in FIGS. 15A and 15B).

Next, in step S510, it is determined whether or not the charge current Ic is greater than the charge current Id (i.e., Ic>Id), and if Yes, the procedure proceeds to step S511, and if No, the procedure proceeds to step S513. That is, this step determines whether the change in the charge current is increase or decrease.

Next, in step S511, output is obtained from the differential amplifier 23a through the third A/D 26a. That is, a differential value is calculated. At the time when the switch SW is switched in step S505, Vc (=Vth) which is the both-end voltage value of the secondary battery B when the charge current value Ic is measured, is held in the capacitor C1. At step 3509, Vd which is the both-end voltage value of the secondary battery B when the charge current Id is measured, is held in capacitor C2. Since the + input terminal (i.e., the non-inverting input terminal) of the differential amplifier 23a is connected to the capacitor C1, and the − input terminal (i.e., the inverting input terminal) of the differential amplifier 23a is connected to the capacitor C2, by obtaining the output of the differential amplifier 23a, it is possible to calculate the differential value (Vm=(Vc−Vd)×Av) of the both-end voltages of the secondary battery B when the charge current value Ic is measured and when the charge current Id is measured.

In step S512, the internal resistance value is calculated based on the charge currents Ic and Id obtained in steps S504 and S509, and based on the differential value Vm calculated (obtained) in step S511. That is, the internal resistance R is calculated as R=(Vc−Vd)/(Ic−Id)=Vm/(Ic−Id). Of course, this calculation is carried out with taking account of the amplification factor Av of the differential amplifier 23a.

Meanwhile, in step S513, output is obtained from the differential amplifier 23b through the fourth A/D 26b. That is, a differential value is calculated. Since the + input terminal (i.e., the non-inverting input terminal) of the differential amplifier 23b is connected to the capacitor C2, and the − input terminal (i.e., the inverting input terminal) of the differential amplifier 23b is connected to the capacitor C1, by obtaining the output of the differential amplifier 23b, it is possible to calculate the differential value (Vm=(Vd−Vc)× Av) of the both-end voltages of the secondary battery B when the charge current value Ic is measured and when the charge current Id is measured.

In step S514, the internal resistance value is calculated based on the charge currents Ic and Id obtained in steps S504 and S509, and based on the differential value Vm calculated (obtained) in step S513. That is, the internal resistance R is calculated as R=(Vd−Vc)/(Id−Ic)=Vm/(Id−Ic). Of course, this calculation is carried out with taking account of the amplification factor Av of the differential amplifier 23b.

Although the flowchart in FIG. 14 and the waveform diagrams in FIGS. 15A and 15B show the case of the charging operation, the internal resistance value of the secondary battery B can be measured in the similar manner in the case of the discharge operation. That is, since the both-end voltage value Vc is smaller than the both-end voltage value Vd (Vc<Vd) when the discharge current Ic is greater than the discharge current Id (Ic>Id), a value of the differential amplifier 23b is obtained. Further, since the both-end voltage value Vc is greater than the both-end voltage value Vd (Vc>Vd) when the discharge current Ic is smaller than the discharge current Id (Ic<Id), a value of the differential amplifier 23a is obtained.

As described above, according to this embodiment, the voltage value Vc at the time of the first measurement of the charge (discharge) current Ic is defined as the predetermined threshold value voltage value Vth. Thus, the measurements can be made with the constant SOC. Furthermore, there is no need to temporarily interrupt the charging or discharging to calculate the internal resistance, and the timing of the calculation of the internal resistance will generate naturally and automatically at the time of the charging or discharging of the secondary battery B in the RV or the HEV, for example.

Furthermore, since the internal resistance calculating device is provided with the differential amplifiers 23a and 23b, the internal resistance value can be calculated in both cases of charging and discharging, and in both cases of the increase and decrease in the current.

In the vehicle such as the EV mounted with the above-described internal resistance calculating device 1, the current increases during the acceleration. Thus, if it is desired to measure the internal resistance value during this time, the measurements can be carried out when the current value is increased more than a predetermined value within a predetermined time. Furthermore, the current is decreased during the deceleration. Thus, if it is desired to measure the internal resistance value during this time, the measurements can be carried out when the current value is decreased lower than a predetermined value within a predetermined time. Moreover, regenerative current can be controlled during the deceleration. Thus, by coordinating a hydraulic brake such that a driver feels nothing and making a total deceleration amount unchanged, a desired current value to be measured (i.e., for both increase and decrease) ca be generated arbitrarily.

The present invention can be applied where multiple-cell serial connection (i.e., a plurality of secondary batteries are connected to one another in series). In such a case, only one set of the charging unit or the discharging unit for the whole internal resistance calculating device is sufficient.

Figure 16:
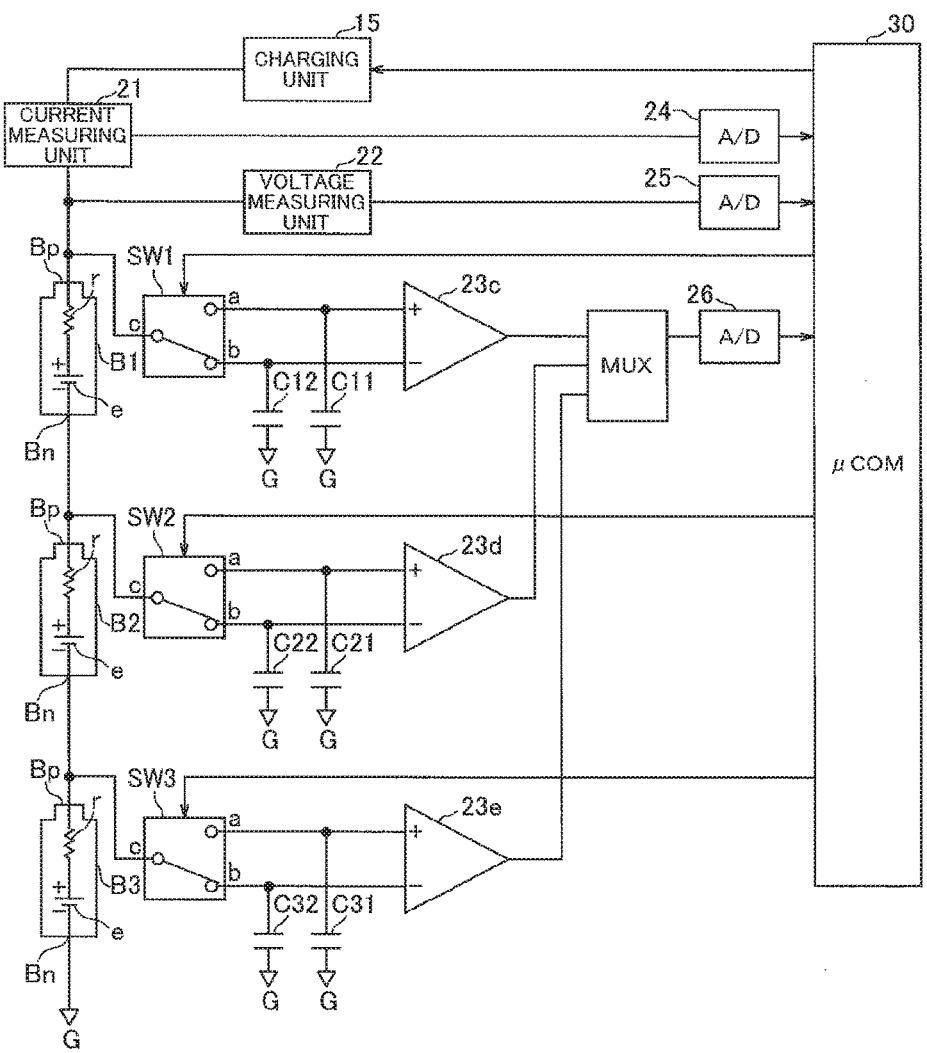
FIG. 16 is a schematic block diagram showing a configuration example of an internal resistance calculating device when two or more cells are connected to one another.
Figure 17:
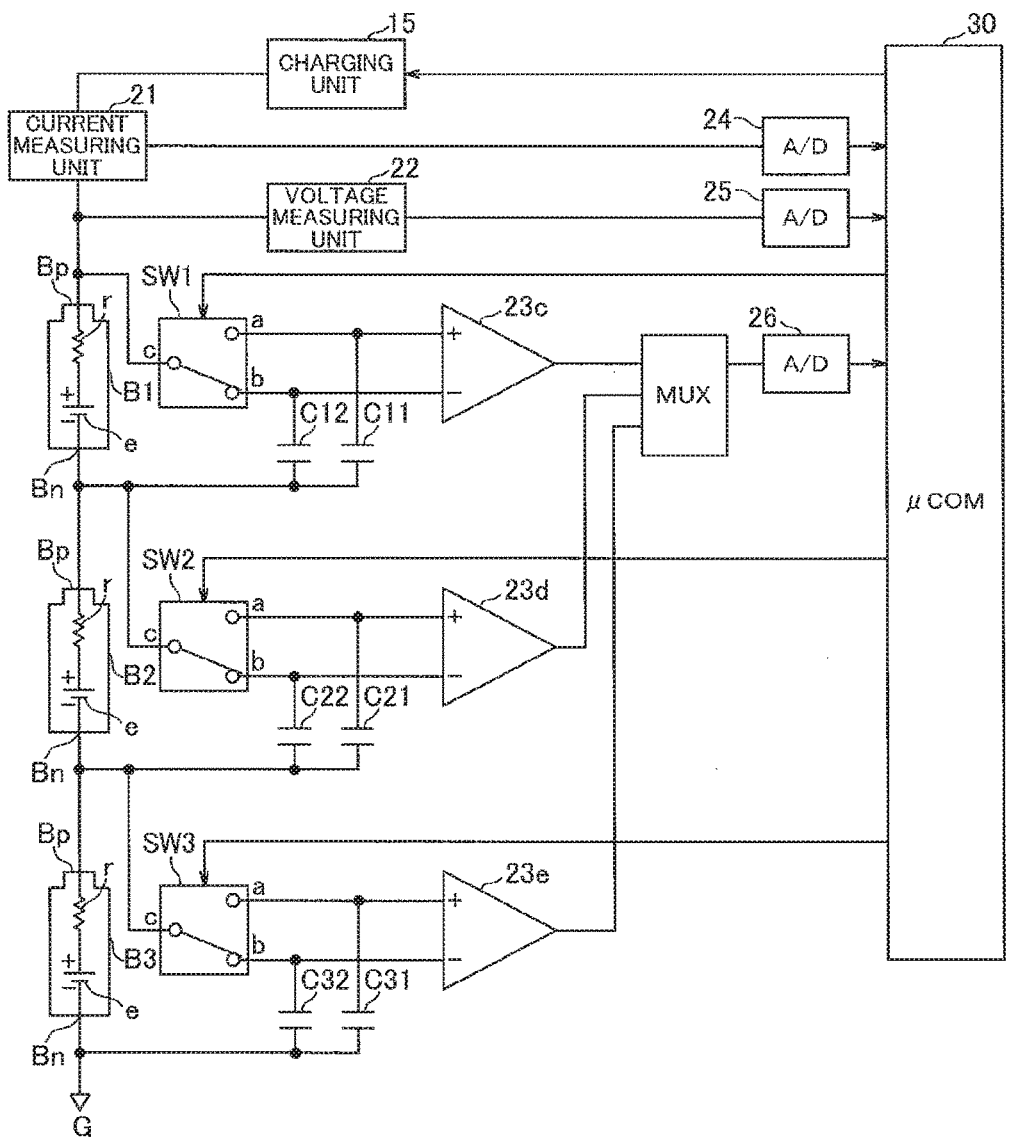
FIG. 17 is a schematic block diagram showing a configuration example of an internal resistance calculating device when two or more cells are connected to one another.

Furthermore, in the case of the multiple-cell serial connection, one analogue-to-digital converter may be provided for every eight cells behind the differential amplifier. In this case, the switch SW, the capacitors C1 and C2 and the differential amplifier may be provided for each of the cells, and a multiplexer (MUX) may select one cell. FIGS. 16 and 17 show examples of the case of three cells. In a configuration shown in FIG. 16, other sides of the capacitors C11, C12, C21 and C22 corresponding to a first cell B1 and a second cell B2 are grounded like other sides of the capacitors C31 and C32 corresponding to a third cell B3. In this case, voltage drops of other cells are included in differential amplifier outputs in which cells other than the third cell B3 to which the negative electrode Bn is grounded. Thus, it is necessary to subtract the voltage drops of other cells in the µCOM 30. According to a configuration in FIG. 17, since capacitors corresponding to cells are connected to negative electrodes Bn of these cells, it is not necessary to subtract the voltage drops of the other cells.

Figure 18:
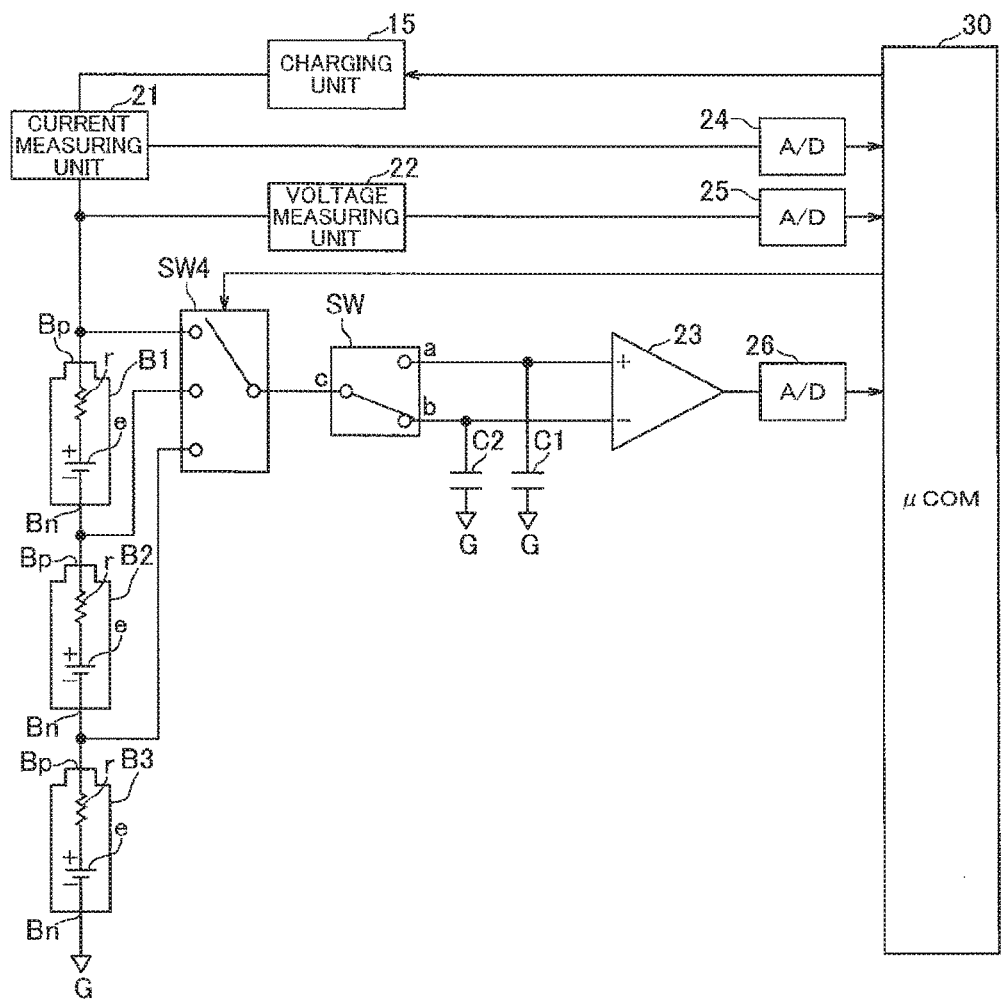
FIG. 18 is a schematic block diagram showing a configuration example of an internal resistance calculating device when two or more cells are connected to one another.
Figure 19:
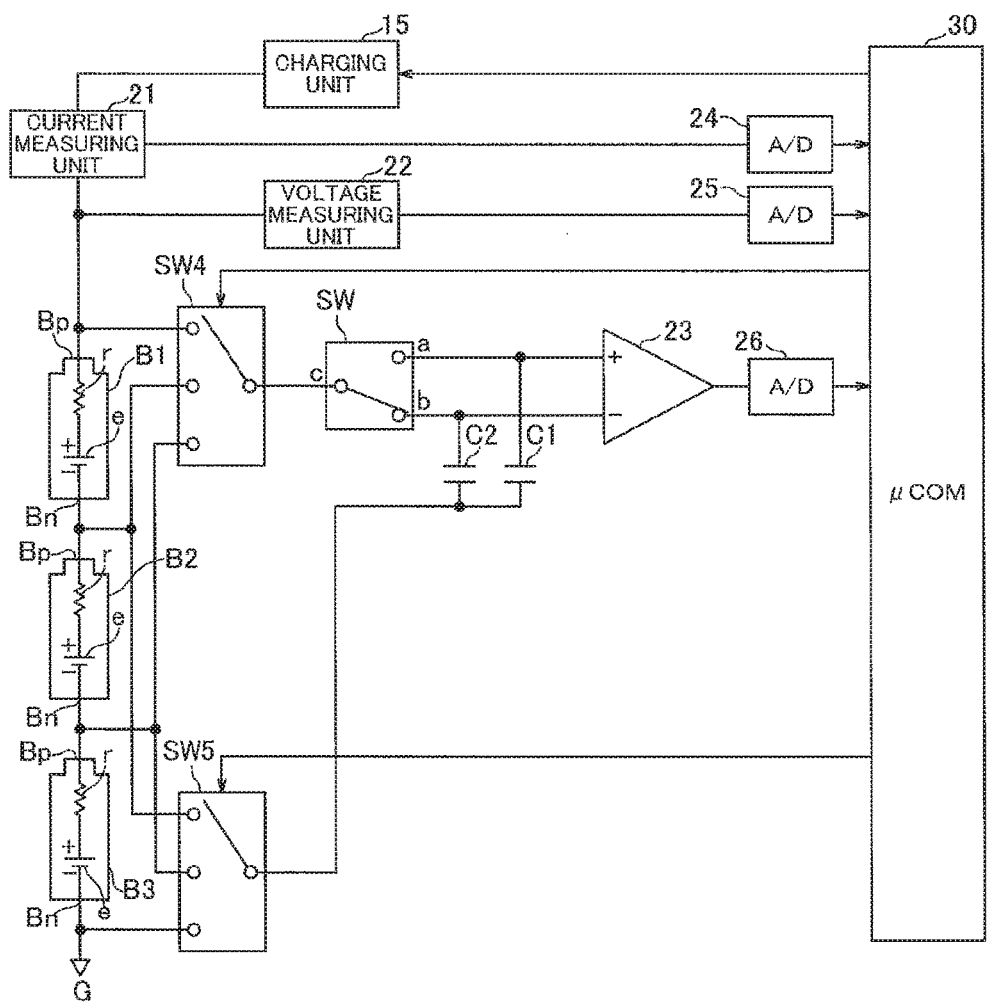
FIG. 19 is a schematic block diagram showing a configuration example of an internal resistance calculating device when two or more cells are connected to one another.

Alternatively, a switch which connects potential on the side of positive electrode of each cell to the differential amplifier may be provided, while providing one set of capacitors C1 and C2 behind the switch, one set of the differential amplifier and one set of analogue-to-digital converter may be provided. (see FIGS. 18 and 19). According to a configuration of FIG. 18, a switch SW4 which selects potential on the side of a positive electrode of each of the cells is provided, and a switch SW shown in FIG. 1, for example, is provided behind the switch SW4. Other sides of the capacitors C1 and C2 are grounded as shown in FIG. 1, for example. In this case, voltage drops of other cells are included in differential amplifier output other than a third cell B3 with which the negative electrode Bn is grounded. Therefore, it is necessary to subtract the voltage drops of other cells in the µCOM 30. According to a configuration in FIG. 19, in addition to the above-described switch SW4, a switch SW5 which selects potential on the side of the negative electrodes of cells is provided. In this case, the switch SW5 switches other sides of the capacitors and they are connected to the negative electrodes of cells to be measured. Consequently, it is not necessary to subtract the voltage drops of other cells.

Although FIGS. 16 to 19 show the configurations in which the configuration of FIG. 1 is applied to the case of the multiple-cell serial connection, the configurations of FIGS. 7 and 13 can also be applied to the case of the multiple-cell serial connection in a similar manner as those shown in FIGS. 16 to 19.

The present invention is not limited to the above-described embodiments. That is, a person skilled in the art can variously carry out within a scope not departing from the subject matter of the invention. These modifications are of course included in a category of the invention as long as the modifications have the configuration of the internal resistance calculating device of the invention.

REFERENCE SIGN LIST 1, 1A, 1B internal resistance calculating device
15 charging unit (charging/discharging unit)
15A discharging unit (charging/discharging unit)
15B charging/discharging unit.
21 current measuring unit
22 voltage measuring unit.
23, 23a, 23b differential amplifier (internal resistance calculating unit.)
30 µCOM (internal resistance calculating unit) secondary battery
C1 capacitor (second voltage obtaining unit, first voltage holding unit, second voltage holding unit)

C2 capacitor (second voltage obtaining unit, first voltage holding unit, second voltage holding unit)
SW switch (switching unit)
R internal resistance value

What is claimed is:

1. An internal resistance calculating device for calculating an internal resistance value of a secondary battery, the device comprising:
   a charging/discharging unit configured to charge or discharge the secondary battery;
   a voltage measuring unit configured to measure a both-end voltage value of the secondary battery;
   a first voltage holding unit configured to hold a first voltage value, the first voltage value corresponding to the both-end voltage value obtained when the both-end voltage value, which is measured by the voltage measuring unit after the charging or the discharging carried out by the charging/discharging unit is started, has become a predetermined threshold voltage value;
   a second voltage holding unit configured to hold, as a second voltage value, the both-end voltage value of the secondary battery when charge current or discharge current is changed for a predetermined value or more within a predetermined time after the both-end voltage value has become the first voltage value;
   a current measuring unit configured to measure
      a first current value which is a charge current value or a discharge current value when the both-end voltage value has become the first voltage value, and
      a second current value which is a charge current value or a discharge current value when the both-end voltage value has become the second voltage value; and
   an internal resistance calculating unit configured to calculate an internal resistance value of the secondary battery based on the first voltage value, the second voltage value, the first current value and the second current value.

2. The internal resistance calculating device according to claim 1, wherein the internal resistance calculating unit includes a differential amplifier configured to calculate a difference between the first voltage value held in the first voltage holding unit and the second voltage value held in the second voltage holding unit.

3. The internal resistance calculating device according to claim 2, wherein each of the first voltage holding unit and the second voltage holding unit is constituted of a capacitor, and
   the internal resistance calculating device includes a switching unit configured to switch between the capacitor holding the first voltage value and the capacitor holding the second voltage value to connect the switched one of the capacitors to one of terminals of the secondary battery.

4. The internal resistance calculating device according to claim 3, wherein the second voltage holding unit holds, as the second voltage value, the both-end voltage value of the secondary battery after charging time of the capacitor is elapsed after the charge current or the discharge current is changed for the predetermined current value or more within the predetermined time, and
   the current measuring unit measures, as the second current value, the charge current value or the discharge current value after the charging time is elapsed.

* * * * *